US012776473B2

(12) United States Patent
Subhi Mohammed Al Disi et al.

(10) Patent No.: US 12,776,473 B2
(45) Date of Patent: Oct. 27, 2026

(54) READOUT CIRCUIT FOR PIXELIZED ELECTRON DETECTOR

(71) Applicant: ASML Netherlands B.V., Veldhoven (NL)

(72) Inventors: Mohammed Subhi Mohammed Al Disi, Delft (NL); Qinwen Fan, Zoetermeer (NL); Stoyan Nihtianov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 507 days.

(21) Appl. No.: 18/115,712

(22) Filed: Feb. 28, 2023

(65) Prior Publication Data

US 2023/0207256 A1 Jun. 29, 2023

Related U.S. Application Data

(63) Continuation of application No. PCT/EP2021/073316, filed on Aug. 24, 2021.

(51) Int. Cl.
*H01J 37/244* (2006.01)
*H01J 37/28* (2006.01)

(52) U.S. Cl.
CPC ............. *H01J 37/244* (2013.01); *H01J 37/28* (2013.01); *H01J 2237/24495* (2013.01)

(58) Field of Classification Search
CPC .......... H01J 37/00; H01J 37/02; H01J 37/244; H01J 37/26; H01J 37/28; H01J 2237/24495; H01J 2237/2441; H01J 2237/2446; G01T 1/17
USPC ................................ 250/306, 307, 311, 397
See application file for complete search history.

(56) References Cited

U.S. PATENT DOCUMENTS

| | | | | |
|---|---|---|---|---|
| 4,420,686 A * | 12/1983 | Onoguchi | H01J 37/28 250/311 |
| 4,767,929 A | 8/1988 | Valentine | |
| 5,449,915 A * | 9/1995 | Yamada | H01J 37/3174 250/397 |
| 9,805,910 B1 * | 10/2017 | Trease | H01J 37/256 |
| 2008/0018505 A1 | 1/2008 | Astley et al. | |

(Continued)

FOREIGN PATENT DOCUMENTS

| | | |
|---|---|---|
| CN | 101110157 B | 3/2011 |
| JP | S64-45122 A | 2/1987 |

(Continued)

OTHER PUBLICATIONS

International Search Report issued in related Foreign Application No. PCT/EP2021/073316; mailed Nov. 15, 2021 (2 pgs.).

(Continued)

*Primary Examiner* — Jason L Mccormack
(74) *Attorney, Agent, or Firm* — Finnegan, Henderson, Farabow, Garrett & Dunner L.L.P.

(57) ABSTRACT

A method of determining a number of charged particles incident on a detector within a period may include generating a first signal that is based on a charged particle impacting a sensing element of the detector, performing processing using the first signal based on a predetermined characteristic of a charged particle arrival event on the detector, and outputting a count signal based on the processing.

13 Claims, 20 Drawing Sheets

(56) References Cited

U.S. PATENT DOCUMENTS

| | | | | |
|---|---|---|---|---|
| 2010/0027747 | A1 | 2/2010 | Mott | |
| 2013/0256540 | A1* | 10/2013 | Teng | H01J 47/001 250/389 |
| 2014/0114596 | A1* | 4/2014 | Kobayashi | G01R 19/255 702/189 |
| 2014/0175279 | A1 | 6/2014 | Agemura | |
| 2014/0252226 | A1* | 9/2014 | Statham | H01J 37/29 250/307 |
| 2017/0328846 | A1* | 11/2017 | Hatano | H01J 37/28 |
| 2019/0304742 | A1 | 10/2019 | Han et al. | |
| 2019/0378682 | A1* | 12/2019 | Wang | G01T 1/247 |

FOREIGN PATENT DOCUMENTS

| | | |
|---|---|---|
| TW | 512651 | 12/2002 |
| TW | 202001972 A | 1/2020 |

OTHER PUBLICATIONS

Office Action of the Intellectual Property Office of Taiwan issued in related Taiwanese Patent Application No. 110131781; mailed May 6, 2022 (12 pgs.).

* cited by examiner

READOUT CIRCUIT FOR PIXELIZED ELECTRON DETECTOR

CROSS-REFERENCE TO RELATED APPLICATIONS

This application claims priority of International application PCT/EP2021/073316, which was filed on 24 Aug. 2021, which claims priority of EP application 20193504.6, which was filed on 28 Aug. 2020. These applications are incorporated herein by reference in their entireties.

FIELD

The description herein relates to charged particle detection, and more particularly, to systems and methods that may be applicable to charged particle beam detection using charged particle counting.

BACKGROUND

Detectors may be used for sensing physically observable phenomena. For example, charged particle beam tools, such as electron microscopes, may comprise detectors that receive charged particles projected from a sample and that output a detection signal. Detection signals can be used to reconstruct images of sample structures under inspection and may be used, for example, to reveal defects in the sample. Detection of defects in a sample is increasingly important in the manufacturing of semiconductor devices, which may include large numbers of densely packed, miniaturized integrated circuit (IC) components. Dedicated inspection tools may be provided for this purpose. For example, a microscopy system using a scanning electron microscope (SEM) may use an electron beam to scan across a sample and derive information from backscattered or secondary electrons generated from the sample.

With continuing miniaturization of semiconductor devices, inspection systems may use lower and lower electron beam currents. As beam current decreases, maintaining signal-to-noise ratio (SNR) becomes even more difficult. To address this issue, electron counting may be used to count individual electron arrival events occurring at a detection cell in a sampling period. However, electron counting may face issues such as error when counting electrons in some situations.

SUMMARY

Embodiments of the present disclosure provide systems and methods for detection based on charged particle beams. In some embodiments, there may be provided a method of determining a number of charged particles incident on a detector within a period. The method may include generating a first signal that is based on a charged particle impacting a sensing element of the detector. The method may include performing processing using the first signal based on a predetermined characteristic of a charged particle arrival event on the detector. The method may include outputting a count signal based on the processing.

In some embodiments, there may be provided a circuit for a charged particle detector including a component configured to generate a first signal that is based on a charged particle impacting a sensing element of the charged particle detector within a period. The circuit may include a compensator configured to process the first signal based on a predetermined characteristic of a charged particle arrival event on the detector.

In some embodiments, there may be provided a method of adjusting power consumption of a detector including determining a parameter of a component of the detector based on a first type of error, and compensating for the first type of error based on a predetermined characteristic of a charged particle arrival event on the detector.

It is to be understood that both the foregoing general description and the following detailed description are exemplary and explanatory only and are not restrictive of the disclosed embodiments, as may be claimed.

BRIEF DESCRIPTION OF THE DRAWINGS

The above and other aspects of the present disclosure will become more apparent from the description of exemplary embodiments, taken in conjunction with the accompanying drawings.

DETAILED DESCRIPTION

Figure 1:
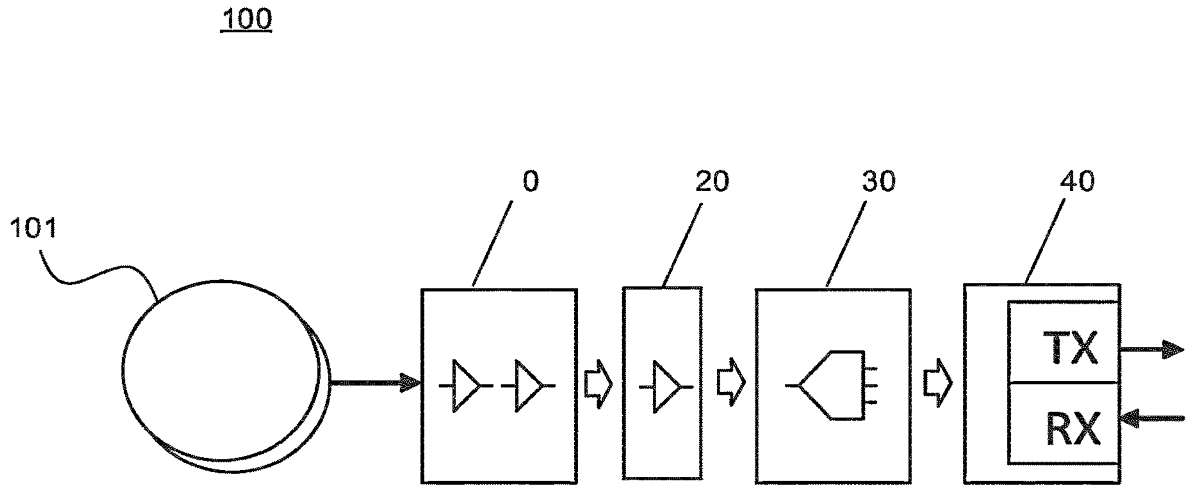
FIG. 1 is a representation of a detection system architecture that may be configured for handling a signal from a detector, consistent with embodiments of the disclosure.

Reference will now be made in detail to exemplary embodiments, examples of which are illustrated in the drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to subject matter that may be recited in the appended claims.

Electronic devices are constructed of circuits formed on a piece of silicon called a substrate. Many circuits may be formed together on the same piece of silicon and are called integrated circuits or ICs. With advancements in technology, the size of these circuits has decreased dramatically so that many more of them can fit on the substrate. For example, an IC chip in a smart phone can be as small as a fingernail and yet may include over 2 billion transistors, the size of each transistor being less than 1/1,000 th the size of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process, that is, to improve the overall yield of the process.

One aspect of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

An image of a wafer may be formed by scanning a primary beam of a SEM system over the wafer and collecting particles (e.g., secondary electrons) generated from the wafer surface at a detector. The process of imaging may include focusing the primary beam to a point, and deflecting (e.g., bending) the beam so that it passes over regions of the wafer in a line-by-line pattern (e.g., a raster scan). As the primary beam scans across the sample, secondary particles are generated and collected at the detector. At a given time, the beam may be focused to a particular position on a wafer, and output of the detector at this time may be correlated to that particular position on the wafer. An image may be reconstructed based on detector output at each time along the beam scan path.

Charged particles landing on a sensing element of the detector may cause an electrical signal to be generated in a circuit connected to the sensing element. In a typical detection system (e.g., an analog signal detection system), the overall intensity of the beam of particles landing on the sensing element is used as the detection signal. The more intense the beam of particles landing on the detector, the larger the detection signal. However, detection systems using overall beam intensity may face issues with accuracy and sensitivity at low levels of beam current. For example, related art detectors may have poor signal-to-noise ratio (SNR), particularly when only a few particles are intermittently landing on the detector rather than a large stream of particles. The raw signal representing beam intensity may be too low and indistinguishable from noise.

An alternative way to detect charged particles is to count individual arrival events. Rather than detecting a signal level representing the strength of a beam incident on a detector, the detector may record individual charged particle arrival events and add them up to determine a total number of particles that may be correlated with strength of the beam. Charged particle counting may improve sensitivity and accuracy at low beam currents and may allow simpler and smaller components to be packaged on a chip relative to, for example, analog signal detection systems, thus allowing robust and reliable detection of charged particles with good SNR. In an exemplary system, when an electron arrives at a sensing element, the circuit connected to the sensing element may generate a signal pulse, and the circuit may detect that an electron arrival event has occurred. While the present disclosure discusses some exemplary embodiments in the context of electrons (e.g., electron counting), it will be understood that the present disclosure may be applicable to other types of charged particles, such as ions.

To help ensure accurate electron counting, a detector should be able to discriminate electron arrival events occurring in close succession. However, issues may be encountered such as the following. First, there may be error related to overlap between subsequent signal pulses. Second, there may be noise-related error that may occur when a circuit of the detector cannot discriminate between noise and the actual pulse associated with an electron arrival event. The first type of error may be referred to as "inter-symbol interference" (ISI) and may be related to signals that are close to one another in time becoming merged due to the speed of the detector being too low.

Addressing the issues above may involve tradeoff relationships with contradicting requirements. For example, decreasing the first type of error (ISI) by increasing speed of detector components (e.g., bandwidth of a preamplifier) may result in increasing the second type of error (noise), thus defeating the purpose of increasing the speed. To counteract this, noise in detector components may be decreased by increasing power consumption of the components, but increased power consumption may lead to other undesirable effects, such as the need for additional heat management measures. Power consumption may become increasingly important as a detector is divided (e.g., pixelated) into an array of multiple smaller detector cells, each requiring its own readout circuit. Thus, it would be desirable to achieve an electron counting detector with high accuracy while maintaining low power consumption, for example without having to use high bandwidth components consuming high power. In particular, a transimpedance amplifier that may be included in a preamplifier may consume significant power, and thus, it would be desirable to limit power consumption of such a component.

Embodiments of the disclosure may address the above issues by relaxing certain constraints on system design. For example, low speed components may be intentionally used such that noise is minimized. Components may be configured to minimize noise, for example, by operating with relatively low speed (e.g., low bandwidth). Components having relatively low speed may lead to higher ISI-type error. This ISI-type error may then be addressed by using a circuit that accounts for ISI, and without significantly increasing power consumption.

ISI may be addressed by using information about the characteristics or behavior of electron arrival events on a sensing element of a detector. For example, the shape of a signal pulse caused by an electron arrival event may be known in advance. It may be expected that the signal pulse will rise and fall over a time period according to certain parameters. This behavior may affect determinations regarding counting of electrons. In some embodiments, a circuit may be configured to make determinations in consideration of the predictable behavior of an electron arrival event. The circuit may compare the level of signal coming from the sensing element to multiple thresholds. In some embodiments, a circuit may modify a signal coming from the sensing element based on known or predictable behavior of electron arrival events. The multiple thresholds or modification of signal may compensate for ISI error that may be caused due to another component being optimized for noise reduction, for example.

A detector may be configured to have a pixelated array of individual sensing elements. Each of the sensing elements may be sized such that no more than a certain number of electrons is received in the area of the sensing element per sampling period. The certain number may be one. The size of the sensing element may be smaller than a geometric spread of electrons incident on the detector. Thus, an individual sensing element may be configured to receive fewer electrons than the total number of electrons incident on the detector. According to various criteria, aspects of the detector may be set so as to accommodate electron counting, such as a size of sensing elements, sampling rate, and other characteristics. Because electron arrival events may involve a stochastic process (e.g., involving some randomness), the sensing element may be expected to receive no more than the certain number of electrons in a sampling period with a certain level of confidence (e.g., 95%). Each sensing element may be connected to a circuit for reading out and processing data.

A circuit connected to a sensing element of the detector may be configured to determine whether an electron arrival event has occurred. There may be parameters of the circuit (e.g., channel speed) that are used to determine other parameters. The circuit may include a preamplifier that transforms a current signal from the sensing element to a voltage signal. The preamplifier may have a speed associated with it. A preamplifier may be configured to have a relatively low bandwidth (and thus, low speed) such that noise is minimized at the expense of ISI-related error. ISI-related error may then be addressed by other components of the circuit. For example, an ISI cancelling discriminator may be provided. The ISI cancelling discriminator may compare the voltage signal from the preamplifier to an adjustable threshold that may be adjusted based on behavior of electron arrival events. Although further components may be involved (e.g., a comparator using multiple thresholds), the power consumption associated with these using further components may be substantially less than that associated with increasing the power consumption of the preamplifier to reduce both noise-related and ISI-related error. Thus, some embodiments may provide for a detector configured to detect low-energy particle with a low error rate and using low power to allow for a high amount of pixelization.

Objects and advantages of the disclosure may be realized by the elements and combinations as set forth in the embodiments discussed herein. However, embodiments of the present disclosure are not necessarily required to achieve such exemplary objects or advantages, and some embodiments may not achieve any of the stated objects or advantages.

Without limiting the scope of the present disclosure, some embodiments may be described in the context of providing systems and methods in systems utilizing electron beams ("e-beams"), particularly with regard to scanning electron microscopy (SEM) systems. However, the disclosure is not so limited. Other types of charged particle beams may be similarly applied. Additionally, charged particle beam may be used in transmission electron microscopy (TEM), scanning transmission electron microscopy (STEM), and the like. Furthermore, systems and methods related to detection may be used in other imaging systems, such as optical imaging, photon detection, x-ray detection, ion detection, etc. Additionally, the term "beamlet" may refer to a constituent part of a beam or a separate beam extracted from an original beam. The term "beam" may refer to beams or beamlets.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C.

Reference is now made to FIG. 1, which shows a representation of a detection system architecture that may be configured for handling a signal from a detector, consistent with embodiments of the disclosure. A detection system 100 may be configured to be used in a charged particle beam apparatus and may be configured for charged particle counting. Examples of a charged particle beam apparatus are discussed in U.S. Pub. No. 2019/0378682 A1, which is herein incorporated by reference in its entirety. For example, a charged particle beam apparatus may be configured to generate a primary beam that is scanned across a sample, and secondary particles (e.g., secondary or backscattered electrons) are collected at a detector. A charged particle beam apparatus may include a single-beam or a multi-beam apparatus.

As shown in FIG. 1, detection system 100 may be provided that includes a detector 101, a signal conditioning circuit 110, an analog signal processing path 120, an ADC 130, and a digital interface 140. Signal conditioning circuit 110 may include circuitry that is configured to process an output of a detection element of detector 101, such as a diode.

A diode, such as a photodiode or PIN diode, may be well suited for use in electron counting. A diode may have high natural internal gain, and thus, even in the case of a single electron arrival event, a strong, measurable signal may be generated that is easily distinguishable against a relatively low floor level of background noise. The need to provide an amplifier or complex systems on a chip, such as avalanche diodes, to boost the signal may be reduced or eliminated. Instead, a signal generated from a diode by itself or with a relatively low-gain amplifier may be well suited for electron counting because it is generated quickly in response to an electron arrival event and stands out against background noise. Furthermore, a diode may be easily segmented.

Figure 2:
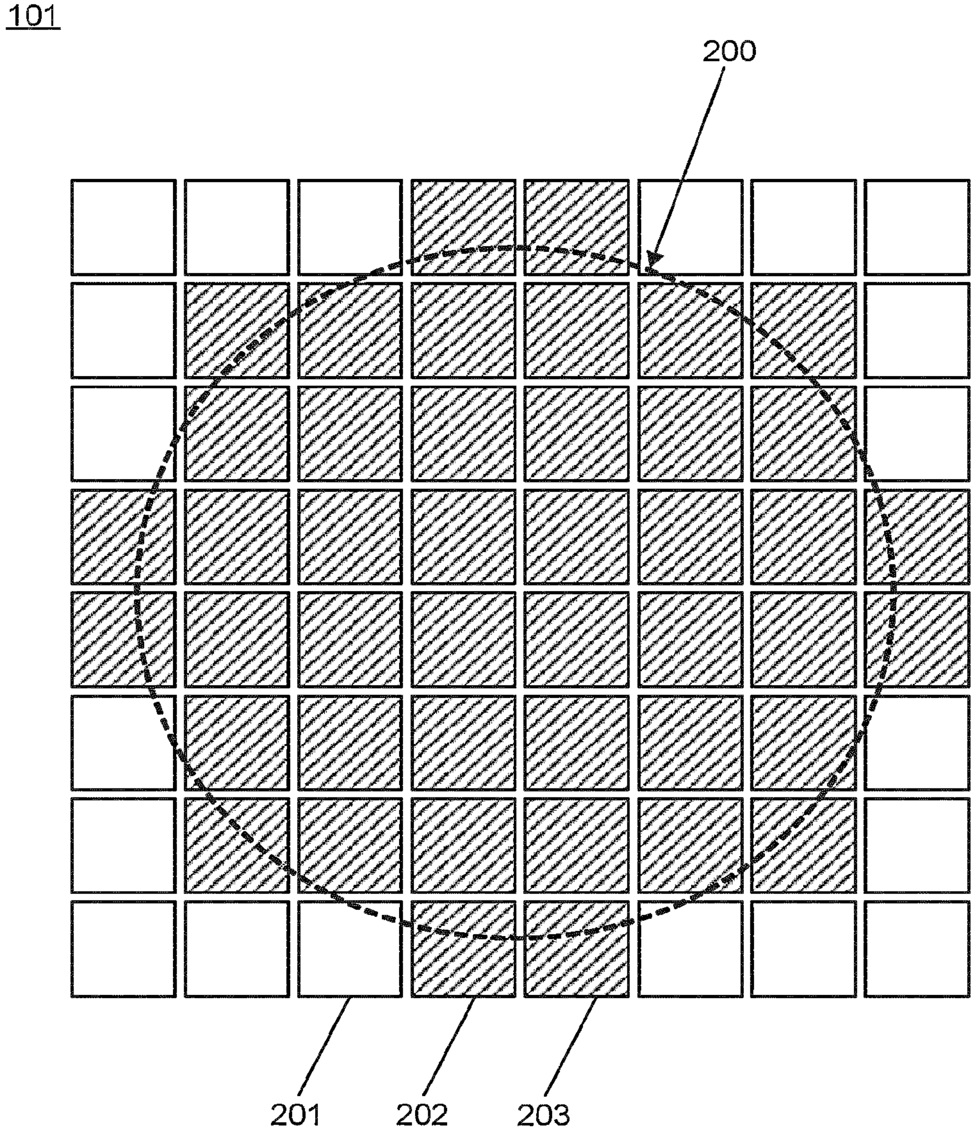
FIG. 2 is a diagrammatic representation of a detection surface of a detector, consistent with embodiments of the disclosure.

FIG. 2 is a diagrammatic representation of a detection surface of a detector, consistent with embodiments of the disclosure. As shown in FIG. 2, detector 101 may include an array of sensing elements, including sensing elements 201, 202, 203, and so on. The sensing elements may be arranged in a planar, two-dimensional array, the plane of the array being substantially perpendicular to an incidence direction of incoming charged particles. In some embodiments, detector 101 may be arranged so as to be inclined relative to the incidence direction.

FIG. 2 shows a spot 200 on detector 101. Some of the sensing elements of detector 101 may be receiving charged particles (e.g., sensing elements 202 and 203) while some sensing elements are not (e.g., sensing element 201). Secondary particles may be formed in response to a primary beam of a charged particle beam apparatus being projected on a sample, and the secondary particles may be directed to detector 101. Although spot 200 may be shown to have a generally round shape, secondary particles may be incident on detector 101 in various other patterns. Furthermore, it will be understood that although spot 200 may be shown with a contiguous shape, charged particles may not necessarily be arriving on the surface of detector 101 in all illuminated sensing elements at once. For example, because of the stochastic nature of charged particle arrival events, some charged particles may arrive at only some sensing elements included within the boundary of spot 200 at a given time, while other sensing elements included within the boundary do not receive any charged particles.

Detector 101 may be configured such that individual sensing elements are sized to receive no more than a certain number of charged particles its area during a sampling period. The detection area of detector 101 may be divided into an array of smaller-area diode elements. Each of the diode elements may correspond to a discrete detection cell. A diode may be pixelated into separate detection cells in various forms. For example, semiconductor detection cells may be divided by virtue of internal fields generated due to internal structures. Furthermore, in some embodiments, there may be physical separation between adjacent sensing elements. That is, in some embodiments, a detector array may be provided with sensing elements that are physically spaced apart from one another. There may be some isolation area provided between adjacent sensing elements.

Size of individual sensing elements may be determined based on various parameters or imaging conditions of a charged particle beam apparatus. For example, a charged particle beam apparatus may be configured to use a primary beam with a certain current level. Current of the beam may be manipulated by apertures or lenses of the charged particle beam apparatus. With a particular beam current, it may be determined that a certain maximum number of charged particles will be incident on a detector. Furthermore, a geometric spread of charged particles incident on the detector may be determined, with some regions having higher distributions of particles. Sensing elements of a detector array may be sized such that it may be ensured with a certain level of confidence that each sensing element will not receive more than a certain number of charged particles in a sampling period. The certain number may be one.

Referring to FIG. 1, signal conditioning circuit 110 may include a current buffer and a transimpedance amplifier (TIA). Analog signal processing path 120 may include a main amplifier. ADC 130 may convert analog signal to an 8-bit digital signal. Digital interface 140 may communicate with components of a charged particle beam apparatus, for example, a deflection and image control (DIC) unit via a transceiver, which may include a transmitter TX and receiver RX. Digital interface 140 may also include a digital switch, a digital control unit, or a controller configured to perform image processing, among other things. Further circuitries may be provided in the architecture, such as a signal processing path that is configured to provide gain and offset control, for example.

Each sensing element of detector 101 may be provided with a corresponding circuit. For example, the architecture of FIG. 1 may correspond with individual circuits that are provided with respect to each of the multiple sensing elements of detector 101 as shown in FIG. 2.

Figure 3A:
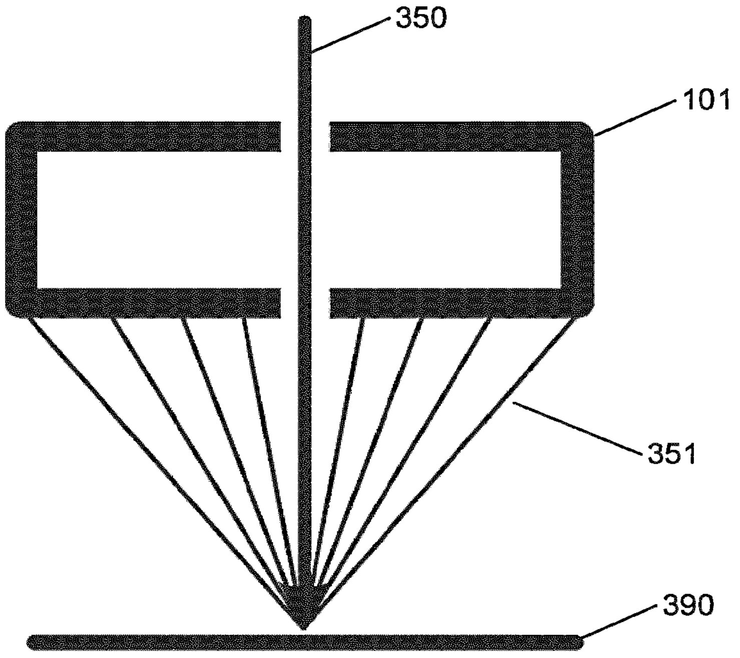
FIG. 3A is a diagrammatic representation of a beam striking a sample and projecting secondary particles on a detector, consistent with embodiments of the disclosure.

Reference is now made to FIG. 3A, which is a diagrammatic representation of a beam striking a sample and projecting secondary particles on a detector, consistent with embodiments of the disclosure. A primary electron beam 350 may be directed toward a sample 390. Primary electron beam 350 may interact with sample 390, and secondary particles may be produced. For example, backscattered electrons 351 may be reflected off the surface of sample 390. Backscattered electrons 351 may be collected by detector 101. Detector 101 may have a through-hole at its center to allow primary electron beam 350 to pass through to reach sample 390. However, some embodiments may use a detector placed off-axis relative to the optical axis along which the primary electron beam travels.

Figure 3B:
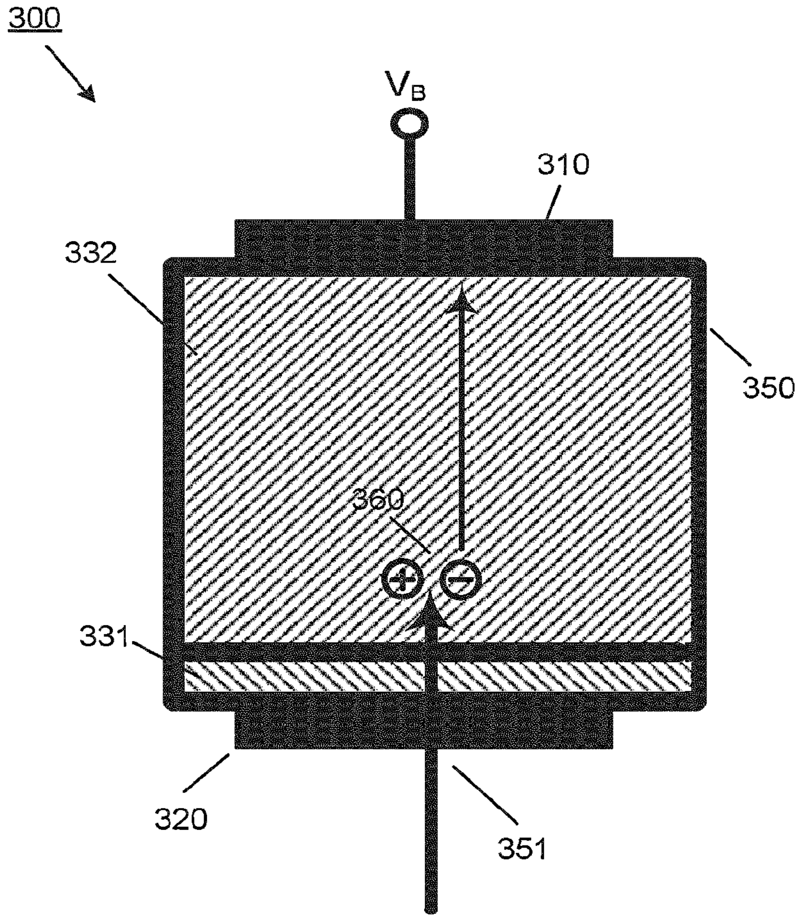
FIG. 3B is a diagrammatic representation of a semiconductor diode that may be included in a detector, consistent with embodiments of the disclosure.

Reference is now made to FIG. 3B, which is a diagrammatic representation of a semiconductor diode 300 that may be included in detector 101, consistent with embodiments of the disclosure. Semiconductor diode 300 may represent a pixel that is a segment of a PIN diode with an internal mechanism of electron-hole pair generation. Semiconductor diode 300 may be an example of a particle sensor configured to absorb energy deposited thereon by a particle and generate charges (e.g., electron-hole pairs) that are swept to the sensor's electrodes by an electric field. Charges may be collected by a readout circuit for further processing.

Diode 300 may include a semiconductor layer 330. Semiconductor layer 330 may include a shallow p+ region 331 and an n epilayer 332. There may be provided a terminal 310 and a contact 320. In operation of a charged particle beam apparatus, primary electron beam 350 may be projected onto sample 390, and secondary particles that may include a backscattered electron 351 may be directed from sample 390 to diode 300. Diode 300 may be configured such that an incoming electron, such as backscattered electron 351, generates electron-hole pairs 360 in semiconductor layer 330. Numerous electron-hole pairs 360 may be generated due to a mechanism triggered by the arrival of an incoming electron, such as impact ionization. Electrons of electron hole pairs 360 may flow to terminal 310 and may form a current pulse in response to the incoming electron arriving at diode 300.

In some embodiments of the disclosure, characteristics of a charged particle arrival event may be used to compensate for error effects. Characteristics of a charged particle (e.g., electron) arrival event may include behavior of a current pulse formed in response to an electron arrival event. Behavior of the current pulse may depend on various parameters of the incoming charged particle, a sensing element receiving the charged particle, or a circuit connected to the sensing element. For example, behavior of a current pulse generated by diode 300 may depend on structure of diode 300 (e.g., its thickness) and on operating conditions (e.g., applied excitation). A bias voltage VB may be applied to diode 300 via terminal 310.

Figure 4:
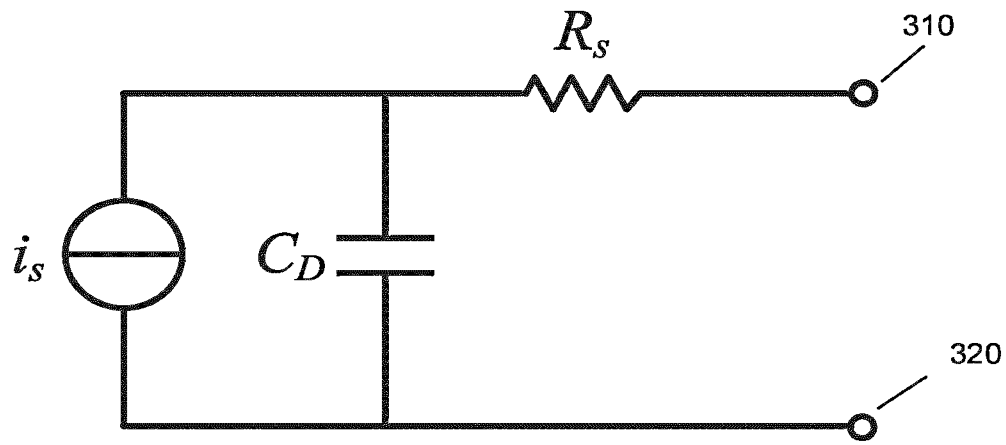
FIG. 4 is a diagrammatic representation of an electrical model of a sensing element and a circuit, consistent with embodiments of the disclosure.

FIG. 4 is a diagrammatic representation of an electrical model of a sensing element and a circuit, consistent with embodiments of the disclosure. Diode 300 may generate a current is in response to an electron arrival event. Diode 300 may exhibit time-dependent behavior and may be represented by a circuit that may be modeled using a capacitor having capacitance CD and a resistor having resistance Rs. CD may represent PIN diode junction capacitance, and Rs may represent PIN diode contact resistance. In some embodiments, a diode itself may have time-dependence and may be modeled as a circuit. In some embodiments, additional circuitry (e.g., other electrical components or wiring) may be provided with a diode, and the diode and its associated circuitry may be modeled as a circuit.

Figure 5:
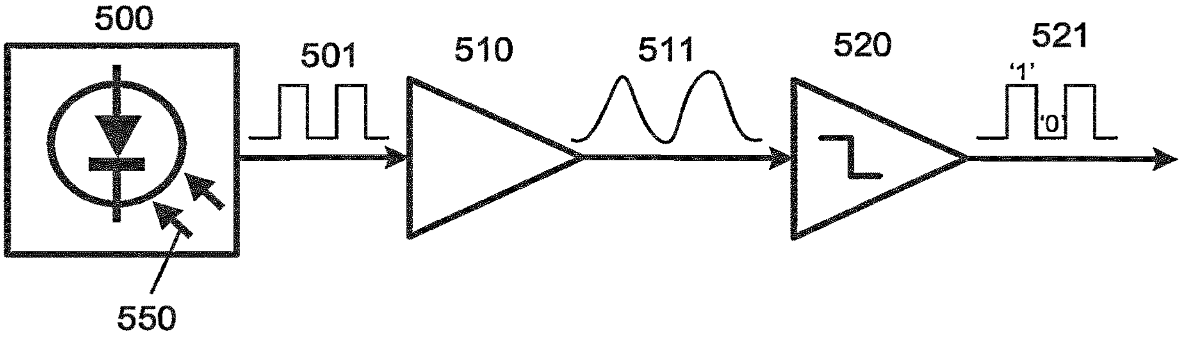
FIG. 5 is a diagrammatic representation of a sensing element and associated signal processing circuit, consistent with embodiments of the disclosure.

FIG. 5 is a diagrammatic representation of a sensing element and associated signal processing circuit, consistent with embodiments of the disclosure. FIG. 5 may represent the frontend of an electron detector. As shown in FIG. 5, a sensor 500 may be connected to a circuit including an input stage 510 and a discriminator 520. Sensor 500 be configured to generate a signal 501 in response to receive a charged particle 550. Sensor 500 may include diode 300 discussed above with reference to FIG. 3B.

As shown in FIG. 5, sensor 500 may generate signal 501. Signal 501 may be a relatively weak, fast current pulse signal. Input stage 510 may be configured to receive signal 501 and output signal 511. Input stage 510 may include a preamplifier that is configured to receive a weak signal and amplify it to a stronger, measurable signal, without inducing significant noise. Furthermore, input stage 510 may include a component to convert signal to another form. For example, input stage 510 may include a transimpedance amplifier (TIA) that is configured to convert current from sensor 500 to a voltage. Signal 501 may include current pulses and signal 511 may include voltage pulses.

Input stage 510 may be connected to discriminator 520. Discriminator 520 may include a compensator. The compensator may be configured to compensate for error effects, such as ISI-related error. The compensator may be configured to use information based on known characteristics of electron arrival events. Discriminator 520 may be configured to make a determination based on signal 511 and output a signal 521. Discriminator 520 may be configured to receive an analog signal and output a digital signal. Discriminator 520 may include a voltage comparator. When input voltage crosses a threshold, discriminator 520 may output a binary signal. For example, discriminator 520 may be configured to compare signal 511 to a fixed threshold (VTH), and when signal 511 exceeds VTH, discriminator 520 may output a binary "1" signal. In some embodiments, discriminator 520 may use an adjustable threshold. There may be multiple thresholds that are used. Discriminator 520 may be configured to indicate the detection of one electron. Discriminator 520 may be configured to generate a counting signal that is used for counting electrons.

Figure 6:
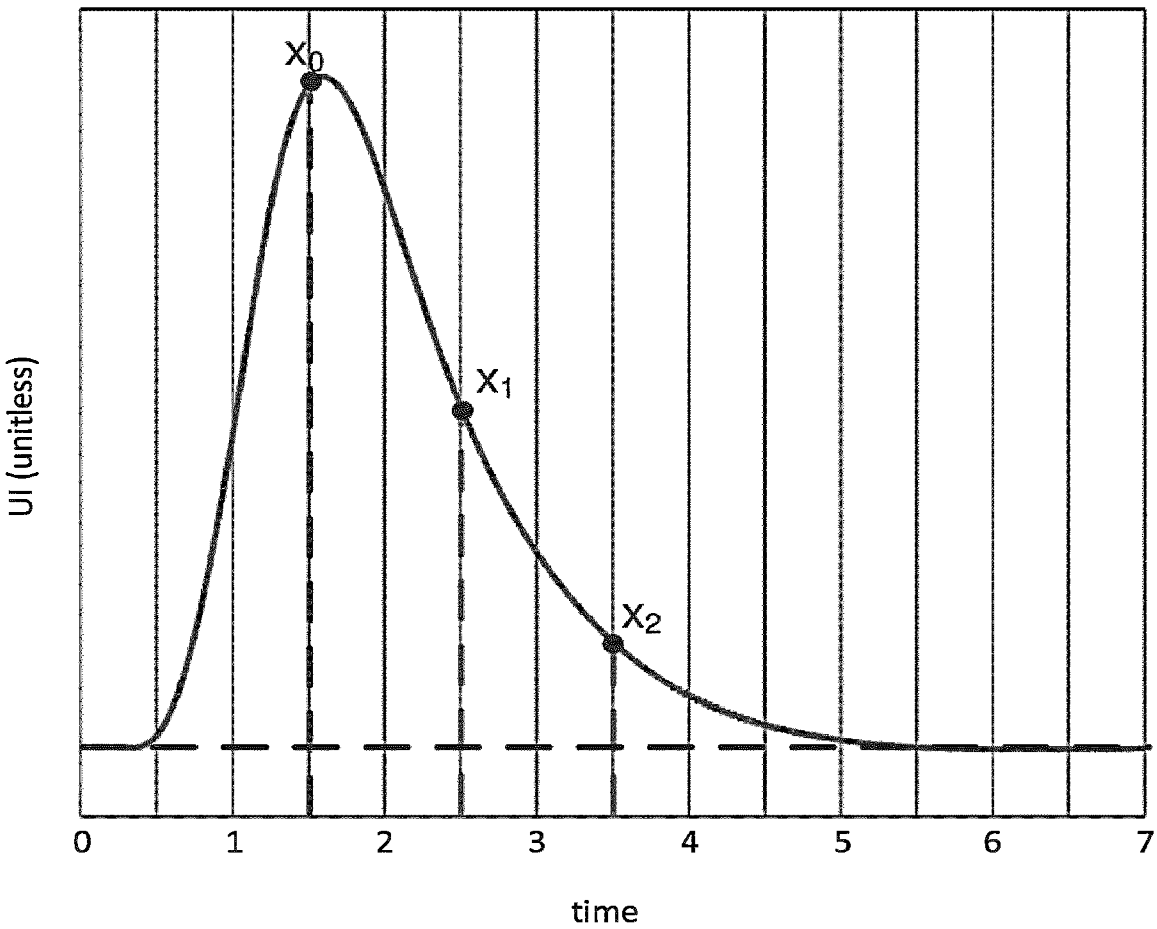
FIG. 6 illustrates an exemplary transient response of a component of a circuit using sensing element output, consistent with embodiments of the disclosure.

FIG. 6 shows an exemplary transient response of a component of a circuit using sensing element output, consistent with embodiments of the disclosure. The horizontal axis of FIG. 6 may represent time and the vertical axis may represent signal output in arbitrary units. FIG. 6 may represent ideal behavior of a component connected to a sensing element of a detector. FIG. 6 may represent a simulated result.

As shown in FIG. 6, signal level may rise to a peak x0. The signal level may rise from a baseline to peak x0 within a predetermined time. Then, after a predetermined time, signal level may fall to an intermediate level x1. Further, signal level may continue to fall to a level x2, and so on. The time it takes for signal to rise to peak x0 may be different from that it takes for signal to fall back down to a baseline.

FIG. 6 may represent a waveform of a signal pulse that may be generated by a component of input stage 510, discussed above with reference to FIG. 5. Signal 511 may include signal pulses that resemble the shape of those in FIG. 6. A transimpedance amplifier included in input stage 510 may be configured to output signal pulses resembling those of FIG. 6. The characteristics of signal pulses may be determined based on properties or operating conditions of components of detection system 100 and may be known in advance. For example, it may be known in advance that a sensing element of a particular type operating with a particular bias voltage will generate signal pulses having a certain shape. The signal pulses may follow a waveform of steep rise to peak x0, and then gradually fall. After, for example, 1 unit of time, there may be residual signal level remaining (e.g., x1). Thus, while signal may rise from 0 to peak x0 in 1 unit of time, the signal may not fall back down to 0 in another 1 unit of time. Even after 2 units of time after reaching peak x0, signal level may remain at level x2. In some embodiments, level x2 may be low enough to be disregarded.

In some embodiments, different models of signal pulse behavior may be used. For example, a signal pulse may have a long tail with more than 2 intermediary signal levels before falling back down to 0. Furthermore, in some embodiments, signal level may fall below a baseline level (the baseline corresponding to the level before the signal pulse; e.g., 0) a certain time after a peak. Models of signal pulse behavior may be based on experimental results or simulation, for example.

Figure 7:
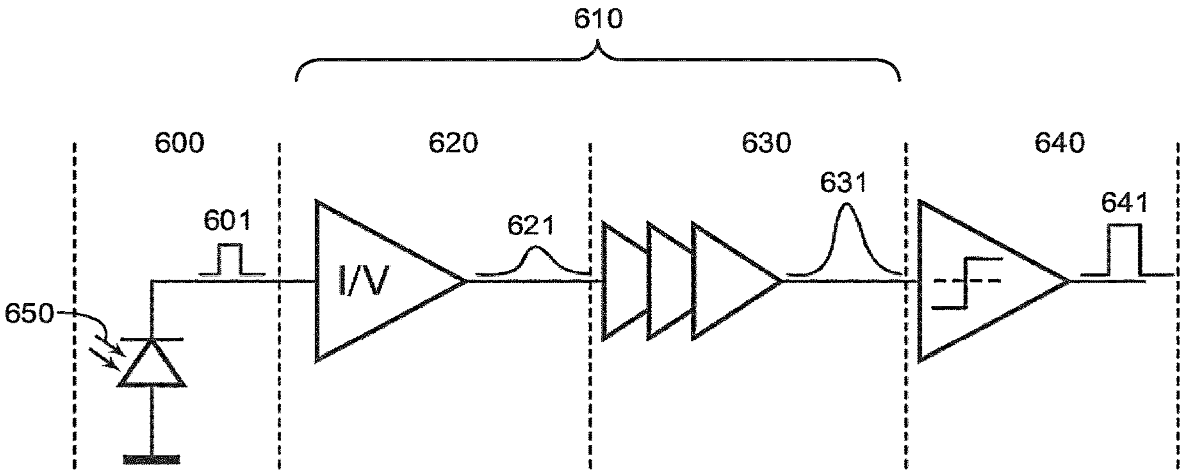
FIG. 7 is a diagrammatic representation of at least a part of a detection system, consistent with embodiments of the disclosure.

Reference is now made to FIG. 7, which is a diagrammatic representation of at least a part of a detection system, consistent with embodiments of the disclosure. The detection system of FIG. 7 may be a variation of the arrangement shown in FIG. 5. FIG. 7 may represent a readout arrangement of a detection system. Circuit components may be provided to read out information provided by a sensor.

As shown in FIG. 7, a sensor 600 may be connected to a circuit including a preamplifier 620, a gain unit 630, and a digitizer 640. An input stage 610 may be formed by preamplifier 620 and gain unit 630. Preamplifier 620 may include a transimpedance amplifier that may be configured to transform a current pulse to a voltage pulse. Gain unit 630 may include a main amplifier. Gain unit 630 may be configured to provide additional gain beyond a gain that may be provided by preamplifier 620 and may boost a signal so that it is less prone to digitization errors.

Sensor 600 may be configured to generate a signal 601 in response to receiving an incoming charged particle 650. Sensor 600 may include a diode, such as a PIN diode. Preamplifier 620 may be configured to receive signal 601 and output signal 621. Gain unit 630 may be configured to amplify an input signal, transforming it into an amplified signal. Signal 621 may include a voltage pulse and signal 631 may include an amplified voltage pulse.

Gain unit 630 may be connected to digitizer 640. Digitizer 640 may be configured to digitize an input signal. Digitizer 640 may include an analog-to-digital converter (ADC), a time-to-digital converter (TDC), or binary discriminator (e.g., comparator or slicer), etc. Digitizer 640 may make a determination based on signal 631 and may output a signal 641. Digitizer 640 may be configured to receive an analog signal and output a digital signal. Output of digitizer 640 may include a “1” or “0”, with “1” corresponding to a charged particle arrival event occurring and “0” corresponding to no charged particle arrival event occurring. Digitizer 640 may include a voltage comparator. Digitizer 640 may include a compensator.

Performance of a detection system may relate to parameters such as signal-to-noise ratio (SNR), bandwidth, and power consumption. Some parameters, such as SNR and bandwidth, may affect error rate of the detection system. Performance of the detection system may depend on performance of individual components of the detection system. For example, in some embodiments, SNR and bandwidth may depend primarily on properties of a preamplifier.

In some embodiments, parameters of a detection system may be interlinked. Relationships between parameters of a detection system may include a tradeoff relationship. For example, bandwidth and noise may be interlinked. That is, as bandwidth is altered, noise may also be affected. Furthermore, in an application such as charged particle (e.g., electron) counting, parameters of the detection system may be related to properties of charged particles and their interaction with the detection system. For example, parameters of the detection system may be related to charged particle separation time (e.g., the period between subsequent electron arrival events). Charged particle arrival events may involve a stochastic process, and separation time may be variable. In some embodiments, the interval between charged particle arrival events may be represented by an average separation time, and there may be a level of confidence associated with the value of average separation time.

In some embodiments, a detection system may be configured for electron counting. To enhance the ability of a detection system to achieve electron counting, the detection system may be configured to discriminate electron arrival events occurring in close succession. Electron arrival events may be represented by a signal pulse. If a detection system is unable to properly discriminate signal pulses, such as two signal pulses occurring in close succession, a counting error may occur, affecting the error rate of the detection system. Error may be related to, for example, noise and effects arising from closeness or overlap between subsequent signal pulses. Noise-related error that may occur when a detection system cannot discriminate between noise and the actual pulse associated with an electron arrival event. Effects arising from closeness or overlap between subsequent signal pulses may include “inter-symbol interference” (ISI). ISI may be related to signals that are close to one another in time becoming merged due to a speed of the detection system. In some embodiments, the speed of the detection system may be primarily determined by the bandwidth of a component of the detection system, such as a preamplifier. ISI may depend on properties of the detection system, properties of the charged particles, and their interaction.

Figure 8:
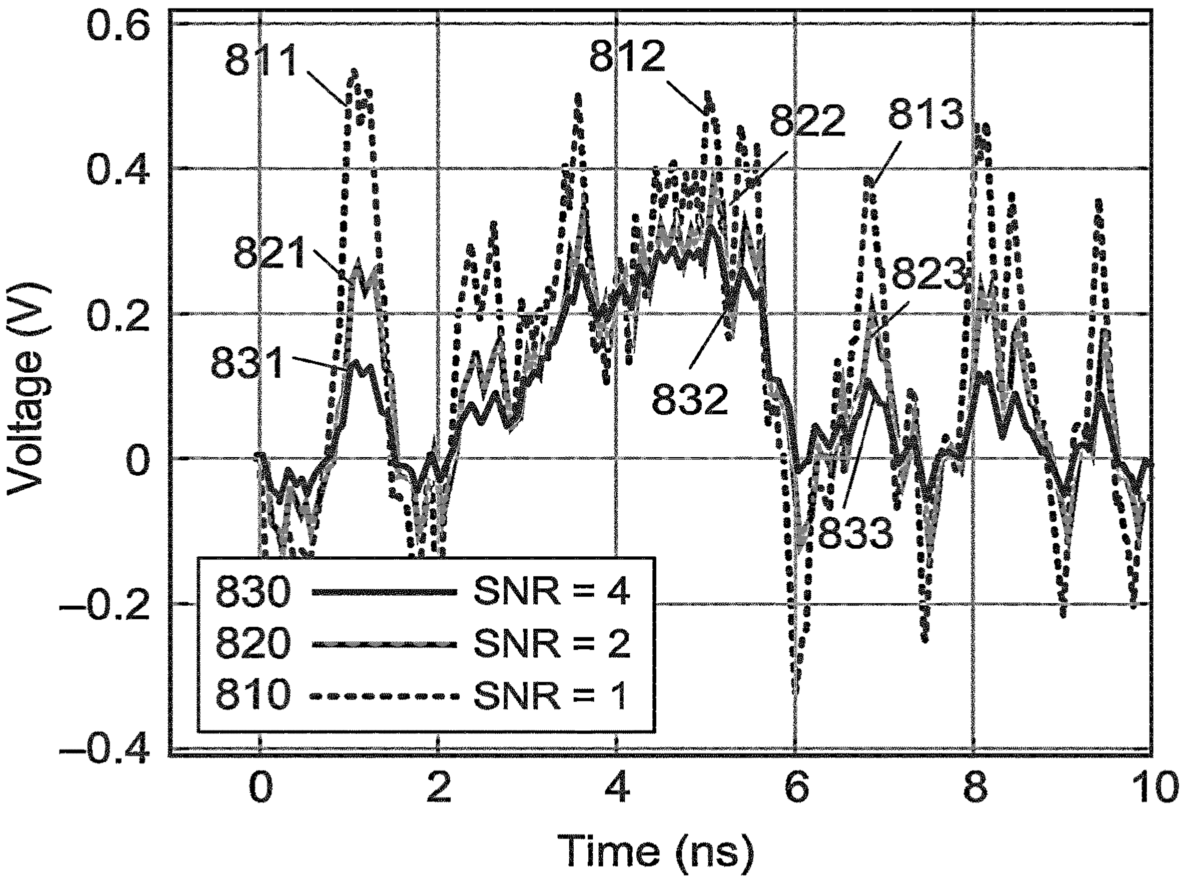
FIG. 8 illustrates a graph of signal output that may demonstrate error related to noise.

FIG. 8 shows a graph of signal output that may demonstrate error related to noise. As SNR increases, the difference between peaks that may be associated with noise and peaks that may be associated with electron arrival events (e.g., peaks corresponding to signal pulses) may become greater, and it may be easier to discriminate between electron arrival events and noise. For example, for waveform 830 shown in FIG. 8 having a SNR of 4 (that is, signal is 4 times stronger than noise), peaks 831, 832, and 833 may be well defined and stand out against background noise. On the other hand, for waveform 810 having a SNR of 1 (that is, signal is equally strong as noise), it may be difficult to discriminate between peaks associated with electron arrival events and background noise.

Figure 9:
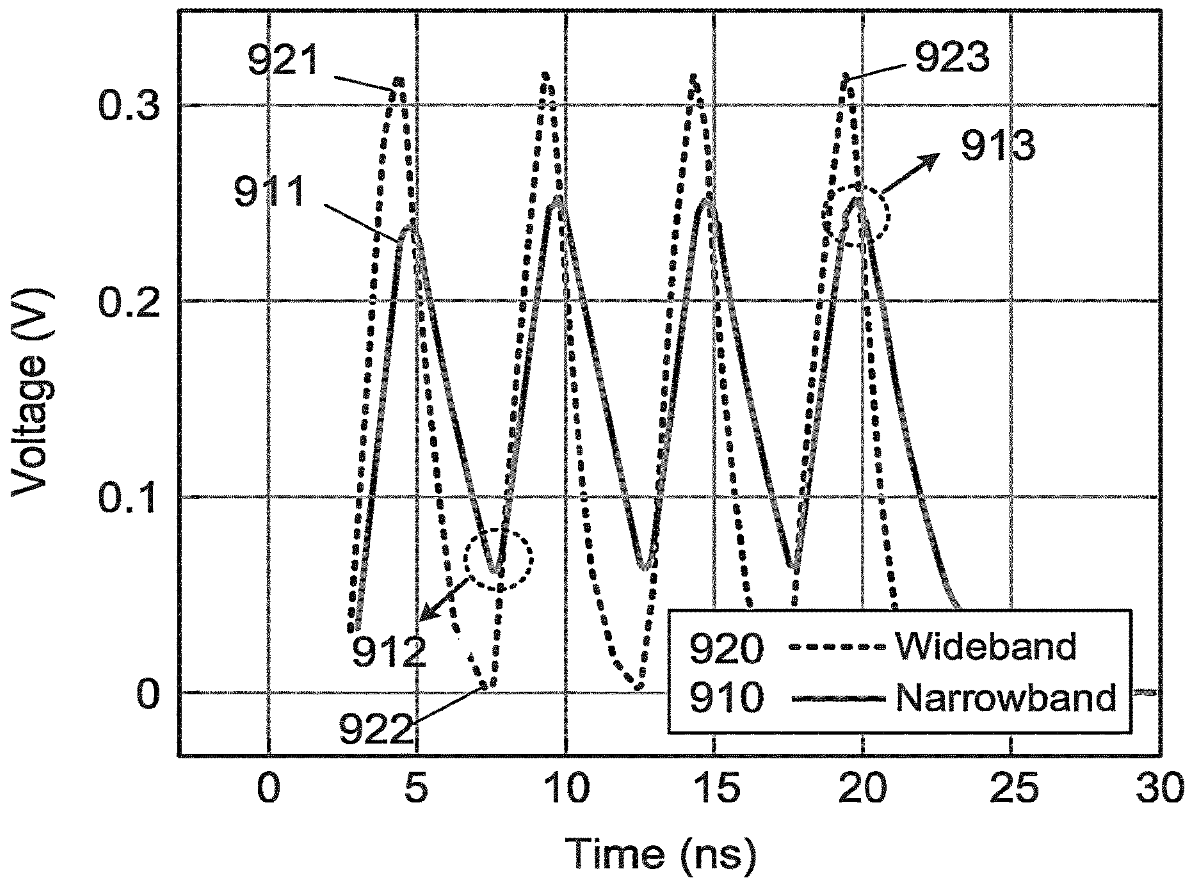
FIG. 9 illustrates a graph of signal output that may demonstrate error or distortion related to inter-symbol interference ("ISI").

FIG. 9 shows a graph of signal output that may demonstrate error or distortion related to ISI. As shown in FIG. 9, output of a wideband preamplifier may be represented by waveform 920. The term “wideband” may mean that a component (e.g., preamplifier) has high bandwidth, and the component may be considered to have a fast speed. Also as shown in FIG. 9, output of a narrowband preamplifier may be represented by waveform 910. The term “narrowband” may mean that a component (e.g., preamplifier) has low bandwidth, and the component may be considered to have a slow speed.

As shown in FIG. 9, waveform 920 may rise to a first peak 921 having a magnitude of approximately 0.31 V. First peak 921 may correspond to a first electron arrival event. Then, waveform 920 may fall to a first trough 922 having a magnitude of approximately 0 V. Also as shown in FIG. 9, waveform 910 may rise to a first peak 911 having a magnitude of approximately 0.23 V. First peak 911 may correspond to a first electron arrival event. Then, waveform 910 may fall to a first trough 912 having a magnitude of approximately 0.08 V. Before waveform 910 fully falls down to 0 V, however, another electron arrival event may occur. Waveform 910 may start rising again before signal level has fully fallen back to a baseline level. This may occur because a component of a detection system (e.g., a preamplifier) has a relatively slow speed such that processing of a first electron arrival event (e.g., outputting a signal pulse) has not completed by the time a new electron arrival event occurs. As the component responds to the new electron arrival event, a residual level of signal may remain. Thus, a slower component may give a distorted response to some electron arrival events. The slower the component, the greater the distortion. Also, the more that residual signals build up, the more they may affect the magnitude of peaks and troughs that may correlate with signal values of 1 or 0. Signal value of 1 may correspond to a charged particle arrival event occurring. Signal value of 0 may correspond to no charged particle arrival event occurring.

As shown in FIG. 9, after several electron arrival events, waveform 920 may rise to a peak 923 having a magnitude of approximately 0.31 V. The magnitude of peak 923 may be substantially the same as that of peak 921. Thus, there is little to no distortion of signal values of 1 or 0. On the other hand, after several electron arrival events, waveform 910 may rise to a peak 913 having a magnitude of approximately 0.24 V. The magnitude of peak 913 may be different from that of peak 911. Thus, there may be distortion of signal values of 1 or 0 when a slower component or lower bandwidth is used.

Figure 10:
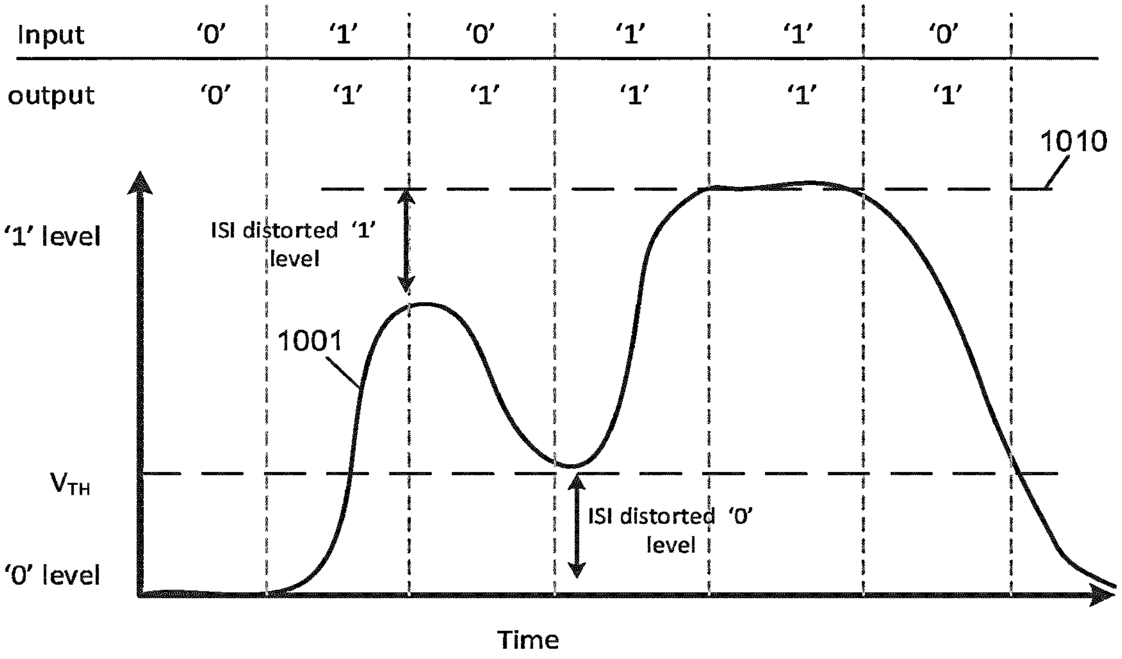
FIG. 10 illustrates a graph of signal output that may be a further representation of effects related to ISI.

FIG. 10 shows a graph of signal output that may be a further representation of effects related to ISI. A waveform 1001 shown in FIG. 10 may represent output of a component of a detection system, such as a preamplifier. Signals may be input to the preamplifier. Input to the preamplifier may be either a 0 or 1, with a 0 representing that no electron arrival event is occurring, and 1 representing that an electron arrival event has occurred. The preamplifier may be configured to process signals input thereto and to output a signal. When output of the preamplifier crosses a threshold (e.g., VTH), it may be determined that an electron arrival event is occurring and an output of 1 may be assigned. When output of the preamplifier is below the threshold, it may be determined that no electron arrival event has occurred and an output of 0 may be assigned.

As shown in FIG. 10, a first electron arrival event may occur, and signal level may rise to a peak above threshold VTH. At this time, input and output of 1 may be in agreement. After the peak of signal level is reached, the signal level may begin to fall. However, the signal level may remain above threshold VTH, and a detection system may determine that output is still 1 when input is 0. This may occur due to bandwidth of a preamplifier being low such that residual signal remains after a peak associated with an initial electron arrival event.

Furthermore, a further electron arrival event may occur, and signal level may begin to rise before it has fully fallen to a baseline level. Thus, a 0 level may be distorted due to ISI. Thereafter, signal level may rise to a higher peak in response to the further electron arrival event. This peak may be distorted due to ISI. For example, the peak may reach a level 1010 that is different from that of the first peak. In some embodiments, ISI effects may be reduced by increasing bandwidth. For example, distortion as seen in waveform 910 in FIG. 9 may be decreased by increasing bandwidth so as to approach waveform 920. However, doing so may introduce further issues.

Figure 11:
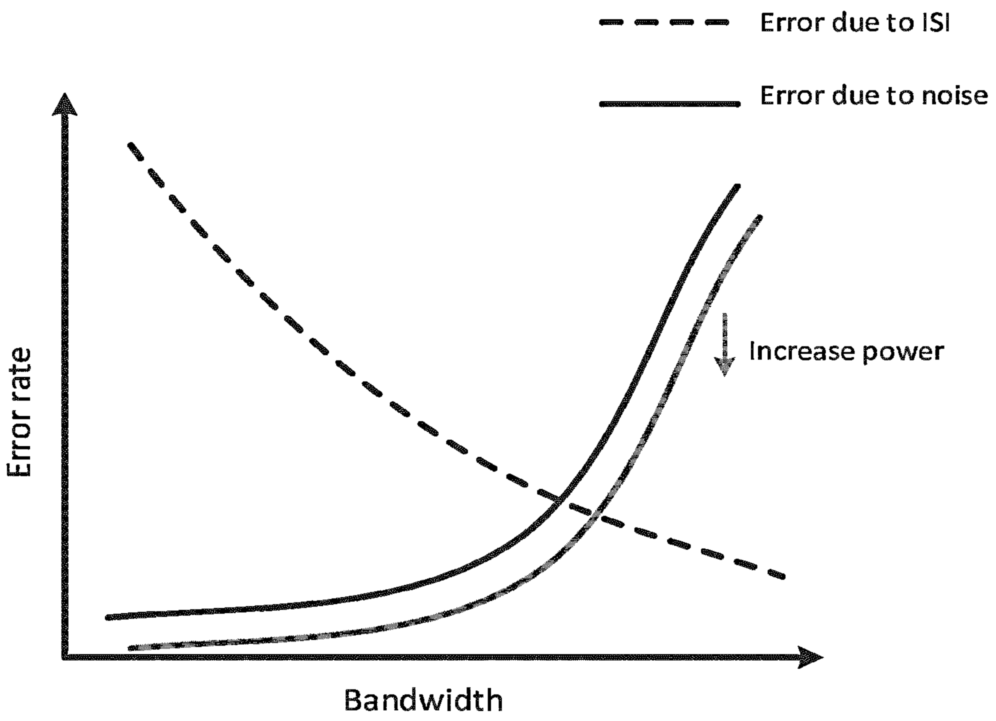
FIG. 11 illustrates a relationship between different sources of error, consistent with embodiments of the present disclosure.

FIG. 11 illustrates a relationship between different sources of error, consistent with embodiments of the present disclosure. Addressing error in a detection system may involve tradeoff relationships with contradicting requirements. For example, reducing effects due to ISI by increasing speed of detector components (e.g., increased bandwidth of a preamplifier) may result in increasing noise (and thus reducing SNR). As shown in FIG. 11, error rate due to ISI may decrease with increased bandwidth, but at the same time, error rate due to noise may increase. Total error may be the sum of error due to noise and error due to ISI. Thus, there may be limited flexibility to reduce error rate by only adjusting bandwidth. In some embodiments, noise in detection system components may be decreased by increasing power consumption of the components. Thus, there may be further opportunities to reduce error rate by increasing power consumption. For example, as shown in FIG. 11, error rate due to noise may be decreased by increasing power consumption. However, increased power consumption may lead to other undesirable effects, such as the need for additional heat management measures. Heat management (e.g., cooling the detection system) may become impractical, especially when a detector array is pixelated and numerous readout circuits (e.g., channels) are provided.

Some embodiments of the disclosure may aim to achieve a high detection rate using low power. A detection system may be provided with low-bandwidth components, such as a preamplifier, and may use a compensator configured to cancel effects of ISI. The detection system may include a discriminator that incorporates the compensator. While the use of low-bandwidth components may cause ISI-related error, a compensator configured to cancel effects of ISI may alleviate such error and enhance the performance of a detection system. Relative to a comparative detection system, a preamplifier may be intentionally slowed down to minimize noise without increasing power consumption. Distortion effects that may result from the slowed down preamplifier may be corrected by using a compensator. A detection system may be achieved with enhanced accuracy and low power consumption.

Figure 12:
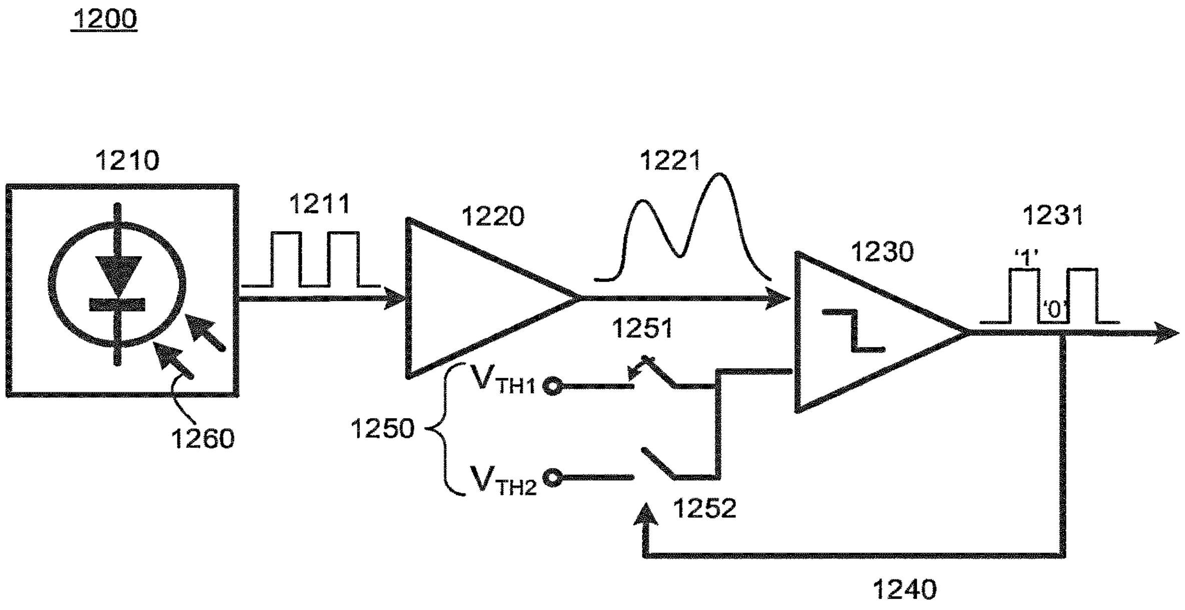
FIG. 12 is a diagrammatic representation of a detection system, consistent with embodiments of the disclosure.

Reference is now made to FIG. 12, which is a diagrammatic representation of a detection system, consistent with embodiments of the disclosure. As shown in FIG. 12, a detection system 1200 may be provided. Detection system 1200 may include a sensor 1210.

Similar to the detection systems of FIG. 5 and FIG. 7, detection system 1200 of FIG. 12 may represent a readout arrangement. Circuit components may be provided to read out information provided by sensor 1210. Sensor 1210 may be configured to generate a response to receiving an incoming charged particle 1260.

As shown in FIG. 12, sensor 1210 may be connected to a circuit including an input stage 1220 and a discriminator 1230. Input stage 1220 may be configured to have a certain parameter (e.g., speed or bandwidth). Input stage 1220 may include a preamplifier. The preamplifier included in input stage 1220 may be a transimpedance amplifier configured to transform a current pulse to a voltage pulse. The preamplifier included in input stage 1220 may be configured to have low bandwidth. Input stage 1220 may be configured to generate some ISI effects. Input stage 1220 may be configured to minimize noise.

A circuit included in detection system 1200 may be configured such that a signal 1211 is generated in response to receiving incoming charged particle 1260 at sensor 1210. Input stage 1220 may be configured to receive signal 1211 and output signal 1221. Signal 1221 may be affected by ISI. For example, as shown in FIG. 12, some peaks and troughs of signal 1221 may be distorted.

Input stage 1220 may be connected to discriminator 1230. Discriminator 1230 may include a compensator. Discriminator 1230 may be configured to perform processing using signal 1221 based on characteristics of a charged particle arrival event. For example, discriminator 1230 may be configured to compensate for ISI effects using a characteristic of charged particles arriving on sensor 1210. The characteristic may be known in advance and may include, for example, behavior of signal pulses generated in detection system 1200 from charged particle arrival events. Discriminator 1230 may be configured to receive signal 1221 and output signal 1231. Signal 1231 may be a digital signal. Discriminator 1230 may be configured to make a determination based on signal 1221 and may output signal 1231 based on the determination. Signal 1231 may include a count signal or a precursor signal that may be used for counting charged particle arrival events. For example, a count of charged particle arrival events may be determined using signal 1231 output from discriminator 1230.

Discriminator 1230 may include a comparator. Discriminator 1230 may be configured to compare signal 1221 to a reference 1250. Reference 1250 may include an adjustable (e.g., dynamic) threshold. One or more fixed thresholds may be provided, and the thresholds may be different from one another. For example, reference 1250 may include a first threshold VTH1 and a second threshold VTH2. In some embodiments, one or both of first threshold VTH1 and second threshold VTH2 themselves are dynamically adjustable, while in other embodiments one or both are fixed. Discriminator 1230 may be configured to switch between first threshold VTH1 and second threshold VTH2. Switching between the thresholds may be based on signal 1231. A feedback loop 1240 may be provided. Feedback loop 1240 may be included in a compensator. Feedback loop 1240 may control a first switch 1251 and a second switch 1252. Feedback loop 1240 may be configured to perform processing using signal 1221 or signal 1231. For example, feedback loop 1240 may be configured to perform compensation using signal 1231 that is based on signal 1221. Feedback loop 1240 may actuate switches 1251, 1252 based on signal 1231.

In some embodiments, discriminator 1230 may be configured to be operable between a plurality of states. In a first state, first switch 1251 may be closed and discriminator 1230 may use first threshold VTH1. Discriminator 1230 may compare signal 1221 to first threshold VTH1 and make a determination based on the comparison. If signal level of signal 1221 crosses first threshold VTH1 (e.g., signal rises above first threshold VTH1), discriminator 1230 may output a "1" as signal 1231, indicating that an electron arrival event has occurred. Otherwise, discriminator 1230 may be configured to output "0" as signal 1231. Detection system 1200 may be configured to start operation from the first state.

Feedback loop 1240 may also make a determination based on signal 1231. Feedback loop 1240 may be configured to actuate switches based on signal 1231, or other information. In response to a "1" being included in signal 1231 while detection system 1200 is in the first state, feedback loop 1240 may be configured to open first switch 1251 and to close second switch 1252.

In a second state, second switch 1252 may be closed and discriminator 1230 may use second threshold VTH2. Discriminator 1230 may compare signal 1221 to second threshold $V_{TH2}$ and make a determination based on the comparison. If signal level of signal 1221 crosses second threshold $V_{TH2}$ (e.g., signal rises above second threshold $V_{TH2}$), discriminator 1230 may output a "1" as signal 1231, indicating that an electron arrival event has occurred. Otherwise, discriminator 1230 may be configured to output "0" as signal 1231.

Thus, feedback loop 1240 may be configured to adjust reference 1250. Discriminator 1230 may be configured to compare signal 1221 to reference 1250, and to output signal 1231 based on such comparison, and feedback loop 1240 may be configured to adjust reference 1250 based on signal 1231. Feedback loop 1240 may be configured to make determinations based on a predetermined characteristic of a charged particle arrival event. For example, determination of whether to adjust reference 1250, and whether to do so in a particular time period, may be based on an expected signal pulse shape of a charged particle arrival event in detection system 1200.

In some embodiments, feedback loop 1240 may be configured to reset reference 1250 after a predetermined number of time periods. For example, feedback loop 1240 may be configured to adjust reference 1250 back to first threshold VTH1 after one or more clock cycles of being at second threshold VTH2. The predetermined number of time periods may be based on the predetermined characteristic of the charged particle arrival event. For example, it may be known that a signal pulse has a residual level of signal within a time period after a peak. As shown in FIG. 6, one time period after peak x0, signal level may still be at level x1. The residual signal level at x1 may be referred to as a "post-cursor." Level x1 may be above a threshold used for determining whether a charged particle arrival event has occurred. Thus, if a comparison of signal level was made a short time after the peak of a signal pulse (e.g., when signal level is still at x1), and the threshold used is below that level (e.g., below x1), a miscount error may occur. To account for such miscounting, an adjustable threshold may be used.

In some embodiments, discriminator 1230 may be configured to output "0" as signal 1231 in a next time period (e.g., the next clock cycle) after outputting "1" as signal 1231 unless it is determined that signal level of signal 1221 crosses second threshold VTH2.

Detection system 1200 may be an example of a double reference readout. Detection system 1200 may take advantage of a predictable waveform shape of current pulses that may be generated by a sensing element (e.g., a diode) and its associated circuit in response to a charged particle arrival event. Detection system 1200 may be configured to cancel distortion related to ISI effects. Current pulses generated in response to charged particle arrival events may be a function of parameters of a sensor or the sensor's associated circuit. For example, current pulses may be a function of a diode's thickness and bias voltage. Such parameters (e.g., diode thickness and applied bias voltage) may have trade off relationships with other parameters, such as the diode's capacitance and thus parameters may be readily manipulated to optimize circuit performance. For example, for a sampling period of 2.5 ns, a diode may be configured to provide a 1.8 ns wide pulse with 90 nA of current. A detection system may be configured to be compatible with the sampling period without significantly increasing input capacitance. In some embodiments, a diode may be configured to provide a signal pulse with a width that is a factor of a sampling period or clock speed of another component of the detection system (e.g., a preamplifier). As used herein, the phrase "a diode configured to provide a signal pulse with a width," etc., may refer to a diode and its associated circuit (or some other component of a detection system) being configured to provide a response to a charged particle arrival event in the form of a signal pulse that may be transmitted through the detection system.

Figure 13:
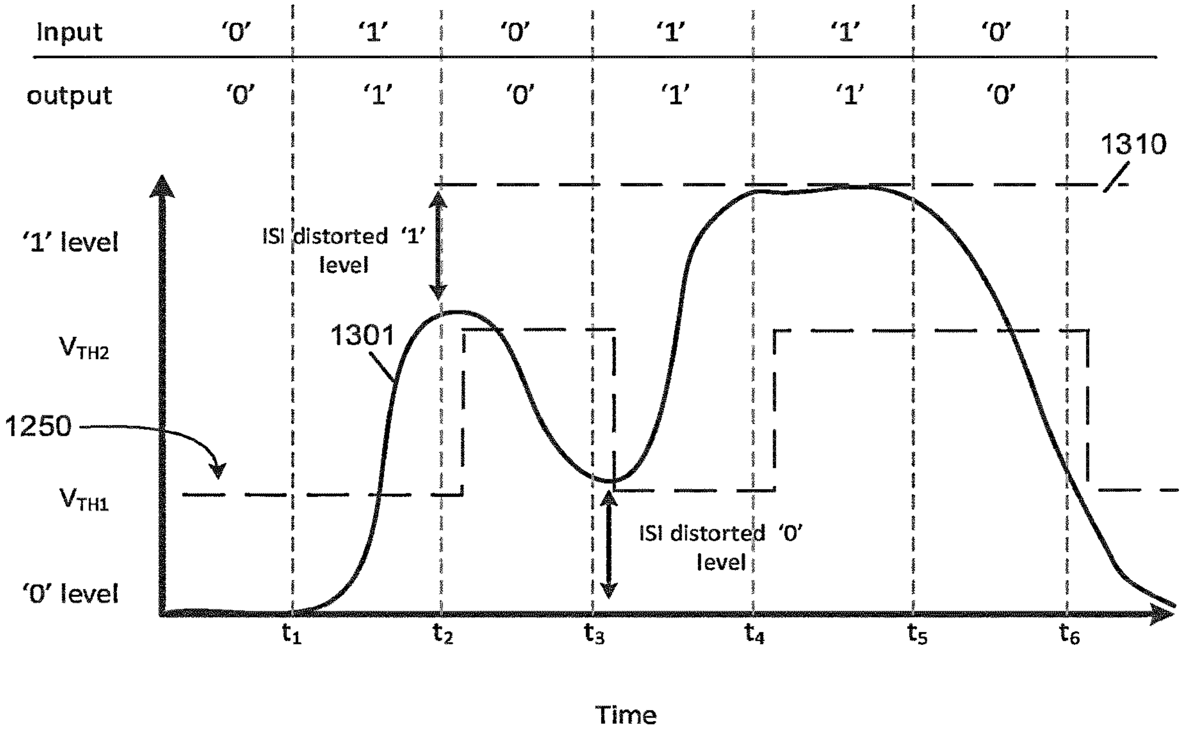
FIG. 13 illustrates a graph of signal output that may be a representation of compensation of effects related to ISI, consistent with embodiments of the disclosure

FIG. 13 shows a graph of signal output that may be a representation of compensation of effects related to ISI, consistent with embodiments of the disclosure. Similar to FIG. 10, a waveform 1301 shown in FIG. 13 may represent output of a component of a detection system, such as a preamplifier. The component may be configured to generate a signal in response to an input. The input may be related to a charged particle arrival event. For example, the component may be configured to generate a signal pulse in response to charges being generated in a sensing element of a detector. Whether a charged particle arrival event has occurred in a time period may be represented by "0" or "1" signals. For example, when a charged particle arrives at a sensing element of a detector within a time period, there may be an input signal of "1." When a component of a detection system generates a signal pulse that crosses a reference, there may be an output signal of "1." Sampling may occur at a time point, and determinations may be made at the time point. For example, as shown in FIG. 13, a moment of sampling may occur at times t1, t2, t3, etc. At time t2, it may be determined that a signal level of waveform 1301 is above reference 1250. At time t2, reference 1250 may be set to VTH1. Thus, an output of "1" may be determined. Also in response to determining that the signal level of waveform 1301 is above reference 1250, it may be determined to change reference 1250 to be set to $V_{TH2}$. Then, at the next sampling point (e.g., $t_3$), it may be determined whether or not the signal level of waveform 1301 is above reference 1250. At time $t_3$, reference 1250 may be set to $V_{TH2}$. Thus, it may be determined that signal level of waveform 1301 is not above reference 1250, and an output of "0" may be determined. Also in response to determining that the signal level of waveform 1301 is not above reference 1250, it may be determined to change reference 1250 to be set to VTH1. In some embodiments, the interval of the sampling times may be adjustable. In some embodiments, the period between sampling intervals may be set as a multiple of clock cycles.

As shown in FIG. 13, reference 1250 may be variable. As discussed above with reference to FIG. 12, reference 1250 may be adjusted based on output of discriminator 1230 and predetermined characteristics of charged particle arrival events. The predetermined characteristics may be based on aspects of the detection system, the charged particles that the detection is configured to detect, and their interaction, for example. Feedback loop 1240 may adjust reference 1250.

As shown in FIG. 13, waveform 1301 may rise to a peak at or around t2 based on a charged particle arrival event occurring. In a time period between t1 and t2, a component, such as discriminator 1230 in detection system 1200 may determine that signal level exceeds reference 1250 and may output a signal of "1." The determination may be made at time t2, for example. At this time, first threshold VTH1 may be used as reference 1250. In the time period between t1 and t2, input and output may be in agreement. A charged particle arrival event may be accurately counted. In response to the output signal of 1, further determinations may be made. For example, reference 1250 may be adjusted.

Upon determining at time t2 that reference 1250 has been exceeded, reference 1250 may be adjusted to second threshold VTH2. At a next sampling point, e.g., at time t3, the component may determine that signal level does not exceed reference 1250 and may output a signal of "0." In the time period between t2 and t3, input and output may again be in agreement. The non-occurrence of a charged particle arrival event may be accurately detected.

As shown in FIG. 13, different from FIG. 10, there may be a period where residual signal level after a peak does not cause a miscounting error. For example, as shown in FIG. 13, in a time period after t2, reference 1250 has been adjusted so as to reduce error.

Furthermore, as shown in FIG. 13, waveform 1301 may include a signal pulse associated with a first charged particle arrival event (e.g., that occurring at t2), and waveform 1301 may again rise soon thereafter in response to a second charged particle arrival event. At time t3, signal level of waveform 1301 has not yet fallen down to a baseline (e.g., the level of signal at t1), but the signal level nevertheless rises due to the second charged particle arrival event. At time t4, waveform 1301 may reach a new peak that corresponds with the second charged particle arrival event. The signal level at the new peak (e.g., level 1310) may be different from that at t2. This may be due to ISI distortion. However, to accommodate for ISI affects, a detection system may be configured to use an adjustable reference, such as reference 1250. As shown in FIG. 13, reference 1250 may be adjusted at time t4. Adjusting of reference 1250 may be based on the second charged particle arrival event.

At a time period between t4 and t5 in FIG. 13, a third charged particle arrival event may occur. Waveform 1301 may be at a signal level that is above reference 1250, and it may be determined that the third charged particle arrival event has occurred (e.g., output is "1"). Signal level of a peak associated with a charged particle arrival event may be different. The differences in signal level may be due to ISI. A detection system may compensate for ISI and may accurately count individual charged particle arrival events.

Selection of parameters for a detection system may be based on a minimum separation time between subsequent charged particle arrival events that is expected for the particular detection system operating with particular operating conditions (e.g., beam current). For example, parameters may be selected based on a separation time with a predetermined level of confidence. Furthermore, a detection system may be optimized to suit a compensator included in the detection system in consideration of operating conditions. For example, bandwidth of a preamplifier may be optimized based on a compensator that includes a double-reference (e.g., using VTH1 and VTH2). In consideration that VTH2 may be selected such that compensator 1230 is configured to detect a "1" input preceded by a "1," the component (e.g., preamplifier) may be configured to guarantee a consistent shape of waveform, even when subsequent charged particle arrival events occur at or close to the minimum separation time. For example, a detection system may be configured such that subsequent charged particle arrival events do not cause additional ISI beyond second threshold VTH2. Additional ISI may be related to pile-up saturation.

Figure 14:
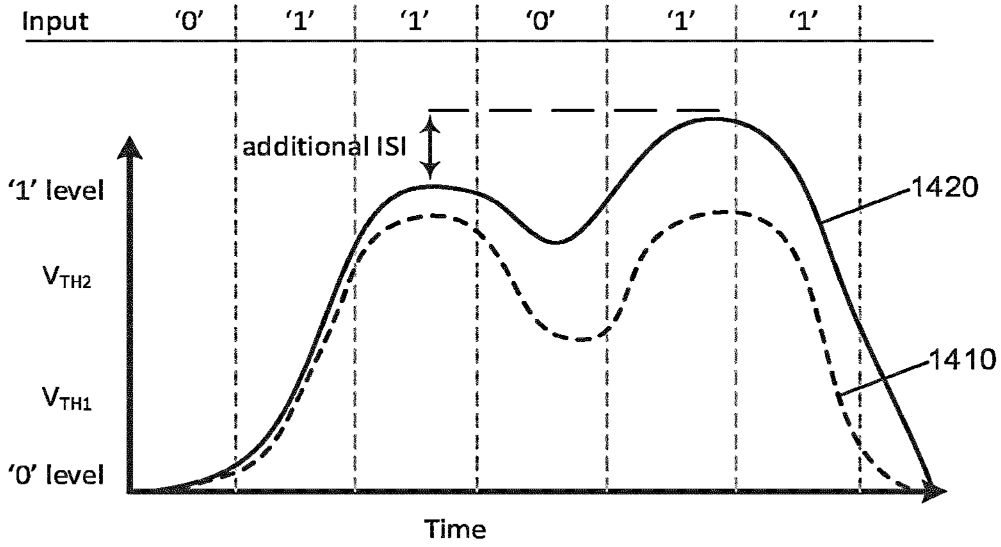
FIG. 14 illustrates an example of consistent waveform generation, consistent with embodiments of the disclosure.

Optimal parameters of a component of a detection system based on ISI compensation may be determined based on additional ISI. For example, as shown in FIG. 14, a component may have parameters that enable consistent waveform generation (e.g., generating symmetric waveforms, or that the pulse shape from arrival events is configured to have a shape similar to a predetermined shape). A preamplifier may have a processing speed such that distortion is caused even above second threshold $V_{TH2}$. As an example, waveform 1420 produces additional ISI. Waveform 1420 may correspond with a preamplifier having a bandwidth that is too low. However, waveform 1410 may correspond with a preamplifier having a bandwidth that is optimal or closer to optimal and does not produce additional ISI.

A detection system including a compensator may enable handling of higher levels of ISI and may relax bandwidth and power requirement of frontend electronics. Thus, an enhancement of the performance of the detection system may be achievable.

In some embodiments, reference 1250 may be adjustable between multiple values. For example, more thresholds may be provided in addition to first threshold VTH1 and a second threshold VTH2. More thresholds may allow for determination of further detailed information relating to charged particle arrival events, such as at what stage a signal pulse may be (e.g., a rising peak, a trailing edge, etc.). Use of further thresholds may enable further flexibility in selecting bandwidth for a preamplifier.

Furthermore, in some embodiments, a range of values may be used for thresholds or signal levels. For example, with reference to FIG. 6, because charged particle arrival events may involve stochastic processes, it may not necessarily be the case that a waveform is sampled at a point corresponding to peak x0. Instead, a waveform may be sampled slightly before or slightly after peak x0. In consideration of this, ranges of values may be used that are based on the average of signal value over a time period (e.g., a sampling period).

Figure 15:
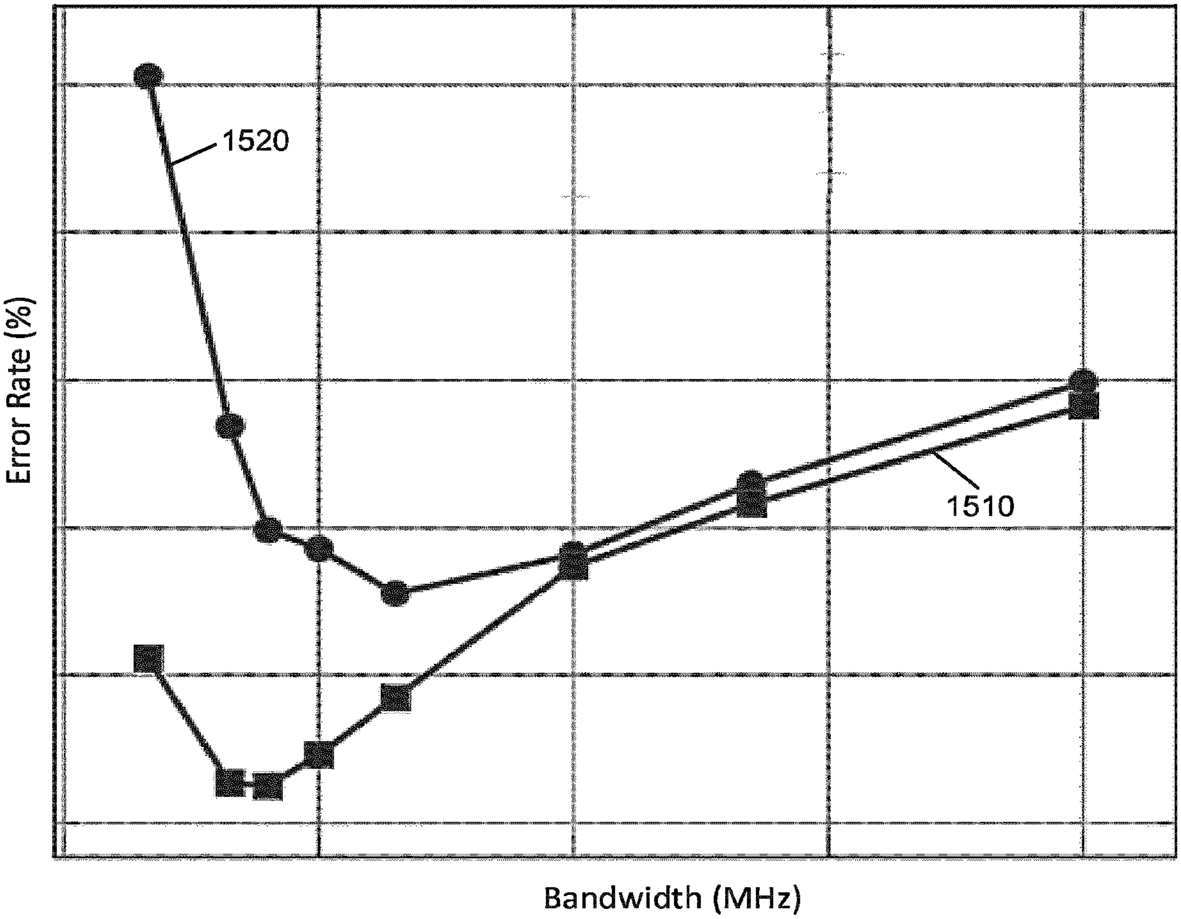
FIG. 15 illustrates a graph with trends of exemplary error rate for comparative example and that for a double-reference readout, consistent with embodiments of the disclosure.

FIG. 15 shows a graph with trends of exemplary error rate for comparative example and that for a double-reference readout, consistent with embodiments of the disclosure. As shown in FIG. 15, a double-reference readout 1510 may enable lower bandwidth and lower error rate than a comparative example 1520. Comparative example 1520 may correspond to a generic readout. Both double-reference readout 1510 and comparative example 1520 may have optimal points where error rate is minimized, but double-reference readout 1510 may enable an optimal point to be achieved that has both lower bandwidth and lower error rate. At higher values of bandwidth, noise-related error may dominate, and error rates of double-reference readout 1510 and comparative example 1520 may begin to converge.

Figure 16:
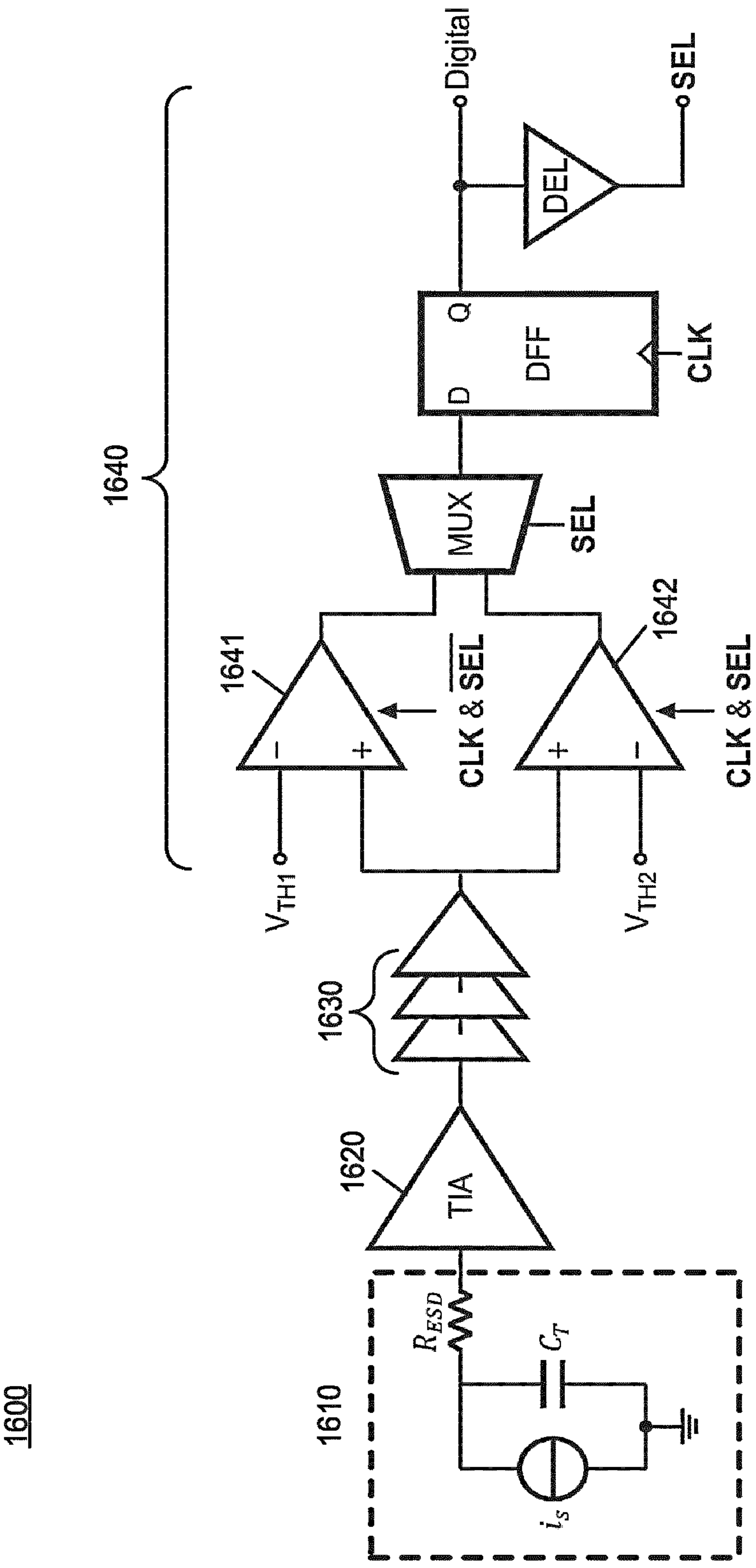
FIG. 16 illustrates an arrangement of a detection system, consistent with embodiments of the disclosure.

FIG. 16 illustrates an alternative arrangement of a detection system, consistent with embodiments of the disclosure. As shown in FIG. 16, a detection system 1600 may include a sensor 1610, a transimpedance amplifier 1620, a gain unit 1630, and a compensator 1640. Sensor 1610 may be configured to generate a current or charge pulse in response to a charged particle arrival event. Transimpedance amplifier 1620 may be configured to generate a voltage pulse based on a signal received from sensor 1610. Gain unit 1630 may be configured to generate an amplified signal based on the voltage pulse from Transimpedance amplifier 1620. Compensator 1640 may include a first comparator 1641 configured to compare the amplified signal to first threshold VTH1, and a second comparator 1642 configured to compare the amplified signal to second threshold VTH2. Compensator 1640 may be configured to process the amplified signal based on a predetermined characteristic of a charged particle arrival event at the sensor. For example, compensator 1640 may select first comparator 1641 or second comparator 1642 based on a previous output from compensator 1640 and in consideration of a predicted waveform of a signal pulse generated in response to a charged particle arrival event in detection system 1600. Compensator 1640 may be configured to compensate for ISI.

Figure 17:
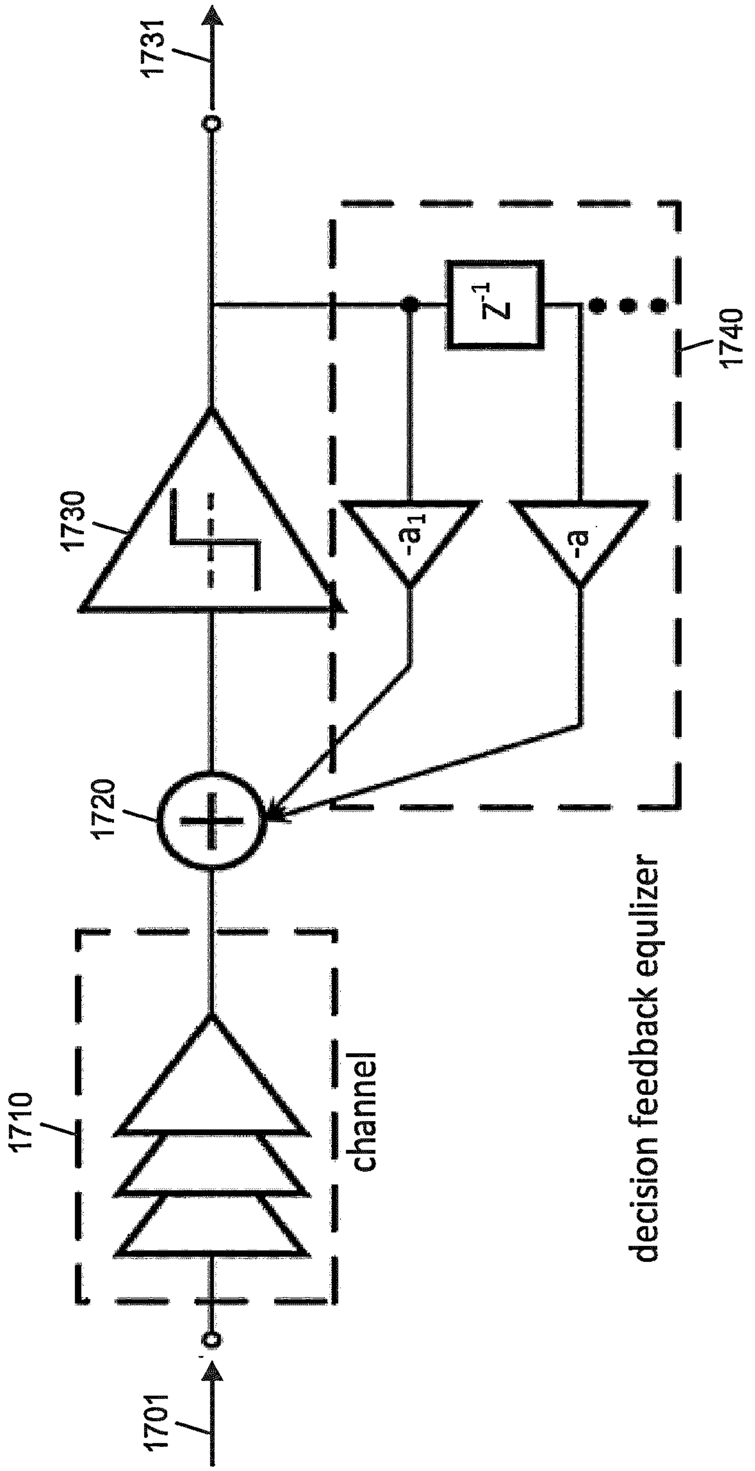
FIG. 17 illustrates an arrangement of a detection system, consistent with embodiments of the disclosure.

FIG. 17 illustrates an alternative arrangement of a detection system, consistent with embodiments of the disclosure. As shown in FIG. 17, there may be provided a channel 1710. Channel 1710 may include a preamplifier or gain unit. An input 1701 may be transmitted to channel 1710. Input 1701 may include a signal generated in response to a charged particle arrival event at a sensing element of a detector. Channel 1710 may transmit a signal to adder 1720. Adder 1720 may perform processing and may transmit a signal to digitizer 1730. Digitizer 1730 may transmit an output 1731. Furthermore, a feedback loop 1740 may be provided. Feedback loop 1740 may perform processing using an output from digitizer 1730 and may transmit information to adder 1720. Feedback loop 1740 may include coefficients a1, a2, . . . etc.

Channel 1710 may be configured with a narrow bandwidth, and there may be some non-zero values of signal that leak into subsequent sampling moments (e.g., post-cursors). Charged particles may arrive randomly at a detector, and there may be times when a time period between arrival events reduces to a level such that, e.g., pile-up may occur. To compensate for pile-up-or-down effects that may result from post-cursors, feedback loop 1740 may use coefficients (including coefficients a1, a2) to subtract out residual signals in a signal pulse.

Embodiments of the disclosure may provide a compensator configured to perform ISI correction. A compensator may use the predictable shape of signal pulses generated from charged particle arrival events and may perform adjustment on an input signal to cancel error effects (e.g., error due to ISI). Some embodiments may enable low-power low-speed electron counting electronics to achieve high-speed and high-accuracy electron detection.

In some embodiments, a characteristic of a charge particle event may correspond to an expected shape of a waveform of a signal pulse generated in response to a charged particle arrival event at a portion of a detector (e.g., a sensing element in a pixelated array). The charged particle may be a secondary or backscattered electron. In some embodiments, incident charged particles on a detector may have different energy. For example, secondary electrons and backscattered electrons may have different landing energy on a detector. Regardless of such energy differences, a signal pulse generated in response to a secondary or backscattered electron arriving at the detector may have exhibit similar behavior. For example, a waveform of a signal pulse from a secondary electron may be substantially the same as that of a backscattered electron. A magnitude of a peak value may be different, but a compensator of a detection system may be configured to compensate for ISI regardless of whether the incident charged particle is a secondary or backscattered electron.

Figure 18:
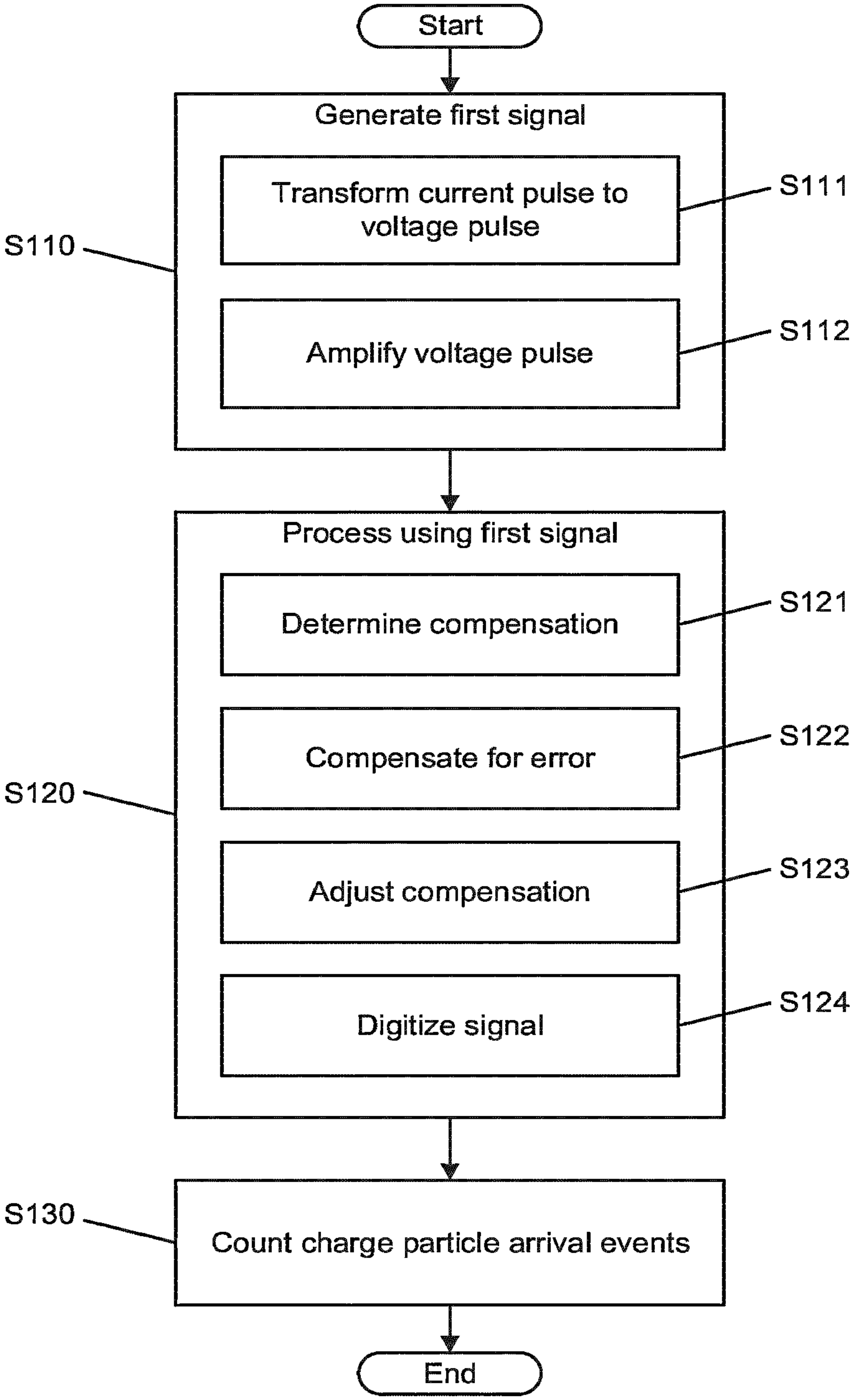
FIG. 18 is a is a flowchart of a method of determining a number of charged particles, consistent with embodiments of the disclosure.

Reference is now may to FIG. 18, which is a flowchart of a method of determining a number of charged particles, consistent with embodiments of the disclosure. A controller of a charge particle beam apparatus may be programmed to implement the flowchart of FIG. 18. A detector included in a charged particle beam apparatus may include circuitry and be configured to implement the flowchart of FIG. 18. A computer-readable medium may store a set of instructions that are executable by a processor of a system to cause the system to perform the flowchart of FIG. 18. The processor may include a plurality of processors. A method may begin with generating a charged particle beam that may be used for inspecting a sample. Charged particles may be projected on the sample, and secondary particles may be directed to a detector. The detector may begin a detection process of receiving secondary particles and analyzing them.

As shown in FIG. 18, a method may include step S110 of generating a first signal. The first signal may include a signal generated in response to a charged particle arriving at a detector. The first signal may be a charge or current pulse that is generated in a sensing element when the charged particle impacts the sensing element. The signal may be fed to a readout circuit that may include an input stage, for example. The first signal may be generated by the input stage.

Step S110 may include a step S111 of transforming a signal from a sensing element to another form. Step S111 may include transforming a current pulse into a voltage pulse. Step S111 may be performed by a preamplifier, such as a transimpedance amplifier. Step S110 may include a step S112 of amplifying a signal. The signal amplified may be a voltage pulse output from a preamplifier. Step S110 may be performed by a gain unit. The first signal may be transformed and amplified and output to another component. The first signal may be generated by a preamplifier. The first signal may be amplified into an amplified signal by a gain unit.

Next, the method may include a step S120 of performing processing using the first signal. Step S120 may include a step S121 of determining compensation. The compensation of step S121 may include ISI distortion compensation. Step S121 may include making a determination that is based on a predetermined characteristic of a charged particle arrival event. For example, it may be determined to compensate the first signal by some value that is based on a shape of a waveform of a signal pulse generated in response to a charged particle arrival event.

Step S120 may include a step S122 of compensating for error. The error compensated for in step S122 may include ISI distortion error. Step S122 may include comparing the first signal to a reference. The reference may be adjustable. Step S122 may be performed by a compensator.

Step S120 may include a step S123 of adjusting compensation. Step S123 may include adjusting the reference used in step S122. Adjusting of compensation in step S123 may be based on the first signal. For example, it may be determined, based on the first signal, that a charged particle arrival event has occurred. Step S123 may include adjusting compensation based on the fact that a charged particle arrival event has occurred. Step S123 may be performed by a feedback loop.

Step S120 may include a step S124 of digitizing using the first signal. Digitizing a signal using the first signal in step S124 may include transforming an analog signal to a digital signal. Step S124 may include generating a binary output. Step S124 may be performed by a digitizer. Step S124 may be performed by a discriminator. A digital signal generated in step S124 may be transmitted to another component. Step S124 may include generating a count signal.

Although FIG. 18 shows step S124 within step S120, in some embodiments, a step of generating or outputting a count signal may be separate from step S120. For example, step S120 may be performed and processing using the first signal may occur. Then, based on the processing using the first signal, a count signal may be output. The count signal may be used as the basis for counting electrons.

Next, as shown in FIG. 18, the method may include a step S130 of counting charged particle arrival events. Step S130 may use the digital signal generated in step S124. Step S130 may be performed by a counting circuit. For example, a digital signal of "1" may be output from a digitizer indicating that a charged particle arrival event has occurred. The counting circuit may increment a counter based on the digital signal of 1. The counting circuit may sum counts from multiple sensing elements or from multiple time periods. The counting circuit may output a number of charged particles incident on a detector in a given time. The counting circuit may output a number of charged particles incident on a region of the detector in a given time.

The method of FIG. 18 may repeat at the end. In some embodiments, the method of FIG. 18 may repeat some steps before ending. For example, steps S110 and S120 may be repeated before a charged particle count is summed. Counts of a region (e.g., a group of pixels) of a detector may be summed before a total charged particle count is determined.

Figure 19:
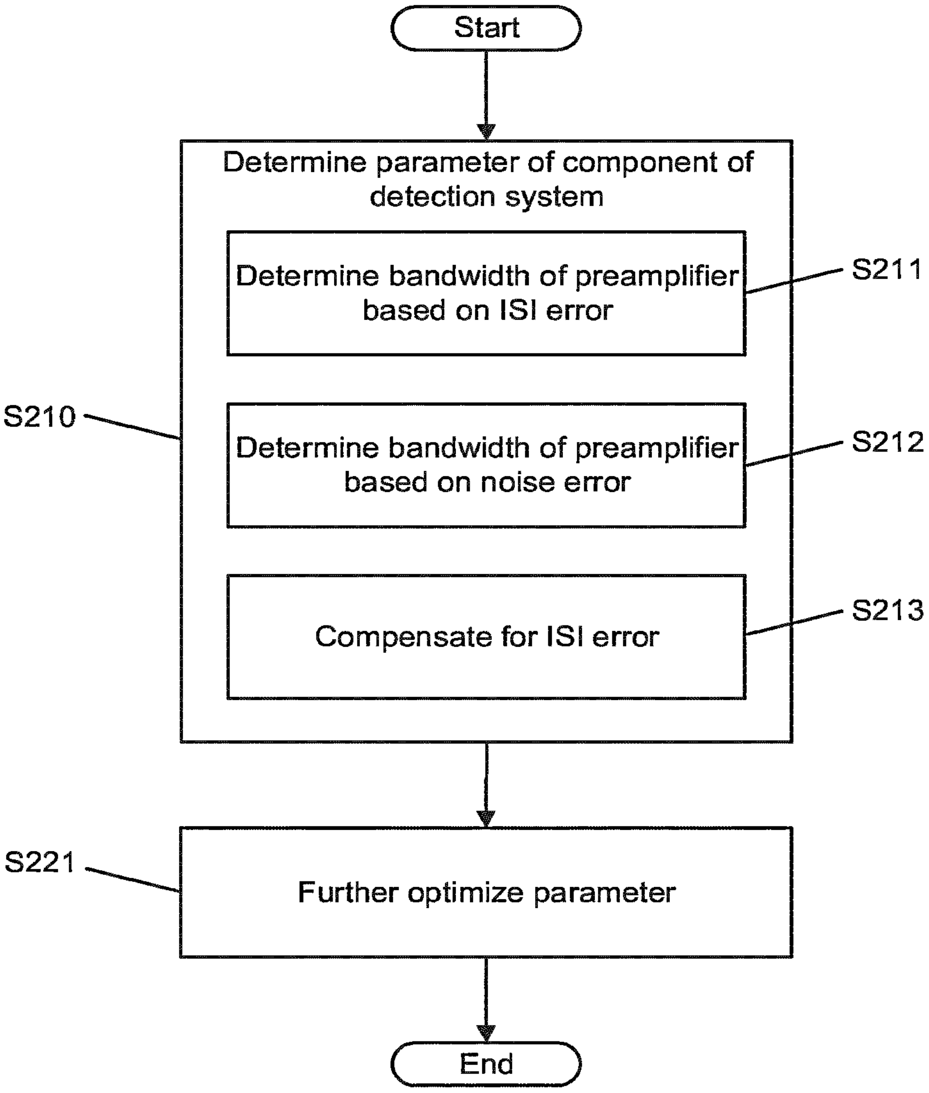
FIG. 19 is a flowchart of a method of adjusting power consumption of a detector, consistent with embodiments of the disclosure.

Reference is now may to FIG. 19, which is a flowchart of a method of adjusting power consumption of a detector, consistent with embodiments of the disclosure. Like the flowchart of FIG. 18, that of FIG. 19 may be implemented by a controller of a charged particle system. A computer-readable medium may store instructions to implement the flowchart of FIG. 19.

In the method of FIG. 19, there may be a step S210 of determining a parameter of a component of a detection system. Step S210 may include optimizing the parameter. The parameter may be bandwidth of a preamplifier of the detection system, for example.

Step S210 may include a step S211 of determining the parameter (e.g., bandwidth) of the component (e.g., preamplifier) based on a first type of error (e.g., ISI error).

Step S210 may include a step S212 of determining the parameter in a way that is different from step S211. Step S210 may include determining the parameter of the component based on a second type of error (e.g., noise error). There may be a relationship between the first type of error and the second type of error. The first type of error may be interlinked with the second type of error. For example, determining to increase bandwidth a preamplifier to minimize error rate based on ISI may have an effect of increasing error rate based on noise.

Step S211 may include setting the parameter in consideration of a minimum speed of the detection system. For example, step S211 may include determining the bandwidth of the preamplifier so as to avoid additional ISI errors that may not be addressable with ISI compensation.

Step S210 may include a step S212 of determining the parameter of the component based on a second type of error. The second type of error may be noise error.

Step S210 may include a step S213 of compensating for the first type of error. Step S213 may include compensating for ISI error. Step S213 may be performed by a compensator of a detection system, for example.

Next, a step S221 of further optimizing the parameter may be performed. Step S221 may include optimizing bandwidth of the preamplifier based on conditions achieved by compensating for ISI error. Step S221 may include adjusting power consumption of the component. Step S221 may include optimizing reference 1250. For example, step S221 may include optimizing of the number of thresholds used, or their values (e.g., how many and what values of VTH1, VTH2, etc.). Step S221 may include optimizing thresholds used in the system of FIG. 16 (e.g., first comparator 1641 or second comparator 1642). In some embodiments, step S221 may include optimizing the number of feedback coefficients or their values (e.g., coefficients a1, a2, in FIG. 17).

The method of FIG. 19 may include reducing power consumption. A detection system may be configured to consume a relatively lower amount of power while achieving similar accuracy to that of a nominal case. In some embodiments, a detection system may be configured to consume similar power as that of a nominal case while achieving higher accuracy.

The embodiments may further be described using the following clauses:

1. A method of determining a number of charged particles incident on a detector within a period, comprising:
generating a first signal that is based on a charged particle impacting a sensing element of the detector;
performing processing using the first signal based on a predetermined characteristic of a charged particle arrival event on the detector; and
outputting a count signal based on the processing.
2. The method of clause 1, wherein generating the first signal includes converting a signal generated by the charged particle impacting the sensing element from a current or charge signal to a voltage signal.
3. The method of clause 1 or clause 2, wherein generating the first signal includes amplifying the first signal to generate an amplified signal.
4. The method of any of clauses 1-3, wherein performing the processing comprises comparing the first signal to an adjustable threshold and, when the adjustable threshold is a first threshold and the first signal crosses the first threshold, changing the adjustable threshold to a second threshold.
5. The method of clause 4, wherein:
the count signal is output in response to the first signal crossing the first threshold when the adjustable threshold is the first threshold, the count signal indicating a first charged particle arrival.
6. The method of clause 4 or clause 5, further comprising:
when the adjustable threshold is the second threshold and the first signal has not crossed the second threshold, changing the adjustable threshold to the first threshold.
7. The method of clause 4 or clause 5, wherein:
the count signal is output in response to the first signal crossing the second threshold when the adjustable threshold is the second threshold, the count signal indicating a second charged particle arrival.
8. The method of any of clauses 4-7, wherein comparing the first signal to the adjustable threshold is performed once per sampling period.
9. The method of any of clauses 1-3, wherein performing the processing comprises adding to the first signal a first amount based on the predetermined characteristic of the charged particle arrival event.

10. The method of clause 9, wherein the first amount includes a negative amount.
11. The method of any of clauses 1-10, wherein the predetermined characteristic includes a waveform shape.
12. The method of any of clauses 1-11, wherein the predetermined characteristic includes a signal pulse width.
13. The method of any of clauses 1-12, wherein the predetermined characteristic includes a residual amount after a peak of a signal pulse.
14. The method of clause 13, wherein the residual amount corresponds to a signal level of a signal pulse after the peak of the signal pulse, by the period.
15. The method of any of clauses 1-14, wherein the period includes a clock cycle of a component performing the method.
16. A method of adjusting power consumption of a detector, comprising:
determining a parameter of a component of the detector based on a first type of error; and
compensating for the first type of error based on a predetermined characteristic of a charged particle arrival event on the detector.
17. The method of clause 16, wherein the first type of error is based on inter-symbol interference.
18. The method of clause 16 or clause 17, further comprising:
determining the parameter of the component based on a second type of error.
19. The method of clause 18, wherein the second type of error is based on noise.
20. The method of clause 18 or 19, further comprising:
optimizing the parameter so as to minimize the second type of error.
21. The method of any of clauses 16-20, wherein the parameter includes bandwidth of a preamplifier of the detector.
22. The method of any of clauses 16-20, further comprising:
further optimizing the parameter based on conditions achieved by compensating for the first type of error.
23. The method of clause 22, wherein further optimizing the parameter includes adjusting the power consumption of the component.
24. A circuit for a charged particle detector comprising:
a component configured to generate a first signal that is based on a charged particle impacting a sensing element of the charged particle detector within a period; and
a compensator configured to perform processing using the first signal based on a predetermined characteristic of a charged particle arrival event on the detector.
25. The circuit of clause 24, further comprising:
an input stage configured to convert a signal generated in response to the charged particle impacting the sensing element to another form.
26. The circuit of clause 25, wherein the input stage includes a preamplifier.
27. The circuit of clause 26, wherein the preamplifier includes a transimpedance amplifier configured to convert a current or charge signal to a voltage signal.
28. The circuit of any of clauses 24-27, wherein the compensator includes a comparator configured to compare the first signal to an adjustable threshold.
29. The circuit of any of clauses 24-27, wherein the compensator includes an adder configured to add an amount to the first signal.
30. The circuit of clause 25, wherein the input stage includes a gain unit configured to amplify the first signal to generate an amplified signal.
31. The circuit of any of clauses 24-30, wherein the compensator is configured to compare the first signal to an adjustable threshold and, when the adjustable threshold is a first threshold and the first signal crosses the threshold, change the adjustable threshold to a second threshold.
32. The circuit of clause 31, wherein the compensator is configured to, in response to the first signal crossing the adjustable threshold when the adjustable threshold is the first threshold, output a signal indicating a first charged particle arrival.
33. The circuit of clause 31 or clause 32, wherein the compensator is configured to change the adjustable threshold to the first threshold when the adjustable threshold is the second threshold and the first signal has not crossed the second threshold.
34. The circuit of clause 31 or clause 32, wherein the compensator is configured to, in response to the first signal crossing the adjustable threshold when the adjustable threshold is the second threshold, output a signal indicating a second charged particle arrival.
35. The circuit of any of clauses 31-34, wherein comparing the first signal to the adjustable threshold is performed once per clock cycle.
36. The circuit of any of clauses 24-35, wherein the compensator includes a digitizer.
37. The circuit of any of clauses 24-36, wherein the compensator is configured to output a count signal based on processing performed by the compensator.
38. A computer readable medium storing a set of instructions that are executable by one or more processors of a system to cause the system to perform a method comprising:
generating a first signal that is based on a charged particle impacting a sensing element of a detector;
in response to the first signal crossing an adjustable reference when the adjustable reference is a first threshold, outputting a first count signal, and
changing the adjustable reference to a second threshold.
39. The medium of clause 38, wherein the set of instructions that are executable by one or more processors of the system to cause the system to further perform:
in response to the first signal crossing the adjustable reference when the adjustable reference is the second threshold, outputting a second count signal.
40. The medium of clause 38 or clause 39, wherein the set of instructions that are executable by one or more processors of the system to cause the system to further perform:
changing the adjustable reference from the second threshold to the first threshold.
41. The medium of clause 40, wherein the adjustable reference is changed from the second threshold to the first threshold after a time period.
42. The medium of any of clauses 38-40, wherein generating the first signal includes converting a signal generated by the charged particle impacting the sensing element from a current or charge signal to a voltage signal.

43. The medium of any of clauses 38-41, wherein generating the first signal includes amplifying the first signal to generate an amplified signal.

44. The medium of any of clauses 38-43, wherein the first signal is compared to the adjustable reference once per sampling period.

45. The medium of any of clauses 38-44, wherein the set of instructions that are executable by one or more processors of the system to cause the system to further perform:

adding to the first signal a first amount based on a predetermined characteristic of the charged particle arrival event.

46. The medium of clause 45, wherein the first amount includes a negative amount.

47. The medium of clause 45 or clause 46, wherein the predetermined characteristic includes a waveform shape.

48. The medium of any of clauses 45-47, wherein the predetermined characteristic includes a signal pulse width.

49. The medium of any of clauses 45-48, wherein the predetermined characteristic includes a residual amount after a peak of a signal pulse.

50. The medium of clause 49, wherein the residual amount corresponds to a signal level of a signal pulse after the peak of the signal pulse, by a period.

51. The medium of clause 50, wherein the period includes a clock cycle of the one or more processors.

52. A computer readable medium storing a set of instructions that are executable by one or more processors of a system to cause the system to perform a method of adjusting power consumption of a detector, the method comprising:

determining a parameter of a component of the detector based on a first type of error; and compensating for the first type of error based on a predetermined characteristic of a charged particle arrival event on the detector.

53. The medium of clause 52, wherein the first type of error is based on inter-symbol interference.

54. The medium of clause 52 or clause 53, wherein the set of instructions that are executable by one or more processors of the system to cause the system to further perform:

determining the parameter of the component based on a second type of error.

55. The medium of clause 54, wherein the second type of error is based on noise.

56. The medium of clause 54 or clause 55, wherein the set of instructions that are executable by one or more processors of the system to cause the system to further perform:

optimizing the parameter so as to minimize the second type of error.

57. The medium of any of clauses 52-56, wherein the parameter includes bandwidth of a preamplifier of the detector.

58. The medium of any of clauses 52-57, wherein the set of instructions that are executable by one or more processors of the system to cause the system to further perform:

further optimizing the parameter based on conditions achieved by compensating for the first type of error.

59. The medium of clause 58, wherein further optimizing the parameter includes adjusting the power consumption of the component.

60. The method of any of clauses 4-7, further comprising:

changing the adjustable threshold from the second threshold to the first threshold.

61. The method of clause 60, wherein the adjustable threshold is changed to the first threshold when the adjustable threshold is the second threshold and the first signal does not cross the second threshold within the period.

62. The method of clause 61, wherein the adjustable threshold is changed to the first threshold when the adjustable threshold is the second threshold and the first signal remains above the second threshold within the period.

63. The method of clause 4, wherein the first signal crossing the first threshold comprises the first signal rising above the first threshold.

64. A method of determining a number of charged particles incident on a detector within a period, comprising:

generating a first signal that is based on a charged particle impacting a sensing element of the detector;

in response to the first signal crossing an adjustable reference when the adjustable reference is a first threshold, outputting a first count signal, and changing the adjustable reference to a second threshold.

65. The method of clause 64, further comprising:

in response to the first signal crossing the adjustable reference when the adjustable reference is the second threshold, outputting a second count signal.

66. The method of clause 64 or clause 65, further comprising:

changing the adjustable reference from the second threshold to the first threshold.

67. The method of clause 64, wherein the adjustable reference is changed from the second threshold to the first threshold after a time period.

68. The method of any of clauses 64-67, wherein generating the first signal includes converting a signal generated by the charged particle impacting the sensing element from a current or charge signal to a voltage signal.

69. The method of any of clauses 64-68, wherein generating the first signal includes amplifying the first signal to generate an amplified signal.

70. The method of any of clauses 64-69, wherein the first signal is compared to the adjustable reference once per clock cycle.

71. The method of any of clauses 64-70, further comprising:

adding to the first signal a first amount based on a predetermined characteristic of the charged particle arrival event.

72. The method of clause 71, wherein the first amount includes a negative amount.

73. The method of clause 71 or clause 72, wherein the predetermined characteristic includes a waveform shape.

74. The method of any of clauses 71-73, wherein the predetermined characteristic includes a signal pulse width.

75. The method of any of clauses 71-74, wherein the predetermined characteristic includes a residual amount after a peak of a signal pulse.

76. The method of clause 75, wherein the residual amount corresponds to a signal level of a signal pulse after the peak of the signal pulse, by a period.

77. The method of clause 76, wherein the period is a clock cycle of the processor.
78. The method of clause 76, wherein the period is a multiple of a clock cycle of the processor.

In some embodiments, a controller may control a charged particle beam system. The controller may include a computer processor. The controller may instruct components of the charged particle beam system to perform various functions, such as controlling a charged particle source to generate a charged particle beam, controlling deflectors to deflect beams or beamlets, and controlling components of a secondary imaging system to direct secondary beams of charged particles to a detector. The controller may also perform functions of determining a parameter of a detection system, performing image acquisition, image processing, etc. The controller may comprise a storage that is a storage medium such as a hard disk, cloud storage, random access memory (RAM), other types of computer readable memory, and the like. The controller may communicate with a cloud storage. A non-transitory computer readable medium may be provided that stores instructions for a processor of controller 109 to carry out beam forming, electron counting, power consumption optimizing, or other functions and methods consistent with the present disclosure. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The block diagrams in the figures may illustrate the architecture, functionality, and operation of possible implementations of systems, methods, and computer hardware or software products according to various exemplary embodiments of the present disclosure. In this regard, each block in a schematic diagram may represent certain arithmetical or logical operation processing that may be implemented using hardware such as an electronic circuit. Blocks may also represent a module, segment, or portion of code that comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. For example, step S211 of determining a parameter based on a first type of error and step S212 of determining the parameter based on a second type of error may occur in a predetermined order. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes can be made without departing from the scope thereof. For example, one or more lenses or other optical components may be added at various points to the particular constructions of exemplary particle-optical system discussed herein. Optical components may be provided for, e.g., magnifying, zooming, and image anti-rotating etc. Optical components may direct charged particles to a detector.

The invention claimed is:

1. A circuit for a charged particle detector comprising:

a component configured to generate a first signal that is based on a charged particle impacting a sensing element of the charged particle detector within a period; and a compensator configured to compensate an error related to an overlap between signals from multiple charged particles impacting the sensing element, wherein the compensator is configured to perform processing using the first signal based on a predetermined characteristic of a charged particle arrival event on the detector, wherein the compensator comprises:

a comparator configured to compare the first signal to an adjustable threshold indicative of the charged particle arrival event.

2. The circuit of claim 1, further comprising:

an input stage configured to convert a signal generated in response to the charged particle impacting the sensing element to another form.

3. The circuit of claim 2, wherein the input stage includes a preamplifier.

4. The circuit of claim 3, wherein the preamplifier includes a transimpedance amplifier configured to convert a current or charge signal to a voltage signal.

5. The circuit of claim 1, wherein the compensator includes an adder configured to add an amount to the first signal.

6. The circuit of claim 2, wherein the input stage includes a gain unit configured to amplify the first signal to generate an amplified signal.

7. The circuit of claim 1, wherein the compensator is configured to, when the adjustable threshold is a first threshold and the first signal crosses the threshold, change the adjustable threshold to a second threshold.

8. The circuit of claim 7, wherein the compensator is configured to, in response to the first signal crossing the adjustable threshold when the adjustable threshold is the first threshold, output a signal indicating a first charged particle arrival.

9. The circuit of claim 7, wherein the compensator is configured to change the adjustable threshold to the first threshold when the adjustable threshold is the second threshold and the first signal has not crossed the second threshold.

10. The circuit of claim 7, wherein the compensator is configured to, in response to the first signal crossing the adjustable threshold when the adjustable threshold is the second threshold, output a signal indicating a second charged particle arrival.

11. The circuit of claim 7, wherein comparing the first signal to the adjustable threshold is performed once per clock cycle.

12. The circuit of claim 1, wherein the compensator includes a digitizer.

13. The circuit of claim 1, wherein the compensator is configured to output a count signal based on processing performed by the compensator.

* * * * *